United States Patent
Chuang

(10) Patent No.: US 11,587,828 B2
(45) Date of Patent: Feb. 21, 2023

(54) SEMICONDUCTOR DEVICE WITH GRAPHENE CONDUCTIVE STRUCTURE AND METHOD FOR FORMING THE SAME

(71) Applicant: NANYA TECHNOLOGY CORPORATION, New Taipei (TW)

(72) Inventor: Ching-Cheng Chuang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 351 days.

(21) Appl. No.: 16/990,676

(22) Filed: Aug. 11, 2020

(65) Prior Publication Data

US 2022/0051936 A1    Feb. 17, 2022

(51) Int. Cl.
*H01L 23/532* (2006.01)
*H01L 21/768* (2006.01)
*H01L 23/482* (2006.01)

(52) U.S. Cl.
CPC .. *H01L 21/76846* (2013.01); *H01L 21/76829* (2013.01); *H01L 23/4827* (2013.01); *H01L 23/53209* (2013.01)

(58) Field of Classification Search
CPC ......... H01L 29/12606; H01L 23/53276; H01L 23/5386; H01L 21/76877; H01L 21/76897; H01L 23/53209; H01L 29/665; H01L 29/66507; H01L 27/10805; H01L 27/10894; H01L 27/11531; H01L 27/11526
See application file for complete search history.

(56) References Cited

U.S. PATENT DOCUMENTS

| 2012/0261829 A1* | 10/2012 | Lin ................... H01L 21/76879 438/666 |
| 2016/0276281 A1* | 9/2016 | Sato ....................... H01L 23/485 |
| 2017/0278750 A1* | 9/2017 | Shinohara ......... H01L 29/66833 |

FOREIGN PATENT DOCUMENTS

| TW | 402792 B | 8/2000 |
| TW | 415081 B | 12/2000 |
| TW | 200532928 A | 10/2005 |
| TW | 201327690 A1 | 7/2013 |

* cited by examiner

*Primary Examiner* — Thanhha S Pham
(74) *Attorney, Agent, or Firm* — Muncy, Geissler, Olds & Lowe, P.C.

(57) ABSTRACT

The present disclosure relates to a semiconductor device and a method for forming a semiconductor device with a graphene conductive structure. The semiconductor device includes a first gate structure disposed over a semiconductor substrate, and a first source/drain region disposed in the semiconductor substrate and adjacent to the first gate structure. The semiconductor device also includes a first silicide layer disposed in the semiconductor substrate and over the first source/drain region, and a graphene conductive structure disposed over the first silicide layer. The semiconductor device further includes a first dielectric layer covering the first gate structure, and a second dielectric layer disposed over the first dielectric layer. The graphene conductive structure is surrounded by the first dielectric layer and the second dielectric layer.

7 Claims, 22 Drawing Sheets

SEMICONDUCTOR DEVICE WITH GRAPHENE CONDUCTIVE STRUCTURE AND METHOD FOR FORMING THE SAME

TECHNICAL FIELD

The present disclosure relates to a semiconductor device and a method for forming the same, and more particularly, to a semiconductor device with a graphene conductive structure and a method for forming the same.

DISCUSSION OF THE BACKGROUND

Semiconductor devices are essential for many modern applications. With the advancement of electronic technology, semiconductor devices are becoming smaller in size while providing greater functionality and including greater amounts of integrated circuitry. Due to the miniaturized scale of semiconductor devices, various types and dimensions of semiconductor devices providing different functionalities are integrated and packaged into a single module. Furthermore, numerous manufacturing operations are implemented for integration of various types of semiconductor devices.

In a semiconductor device, an interconnecting structure is used to electrically connect conductive elements in different layers or in the same layer of an integrated circuit. However, as the semiconductor device scaling-down continues, an interval between adjacent conductive elements is increasingly shrunk, which may decrease the process window of the interconnecting structure. Therefore, it is more and more difficult to manufacture the interconnecting structure in the semiconductor device.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

In one embodiment of the present disclosure, a semiconductor device is provided. The semiconductor device includes a first gate structure disposed over a semiconductor substrate, and a first source/drain region disposed in the semiconductor substrate and adjacent to the first gate structure. The semiconductor device also includes a first silicide layer disposed in the semiconductor substrate and over the first source/drain region, and a graphene conductive structure disposed over the first silicide layer. The semiconductor device further includes a first dielectric layer covering the first gate structure, and a second dielectric layer disposed over the first dielectric layer. The graphene conductive structure is surrounded by the first dielectric layer and the second dielectric layer.

In an embodiment, the semiconductor device further includes a barrier layer disposed between the graphene conductive structure and the first dielectric layer and between the graphene conductive structure and the second dielectric layer. In an embodiment, the barrier layer is in direct contact with the first silicide layer. In an embodiment, the graphene conductive structure is in direct contact with the first silicide layer. In an embodiment, the semiconductor device further includes a second gate structure disposed over the semiconductor substrate, wherein the first source/drain region, the first silicide layer and the graphene conductive structure are disposed between the first gate structure and the second gate structure, and the second gate structure is covered by the first dielectric layer.

In an embodiment, the semiconductor device comprises a cell region and a peripheral circuit region, and wherein the first gate structure, the first source/drain region, the first silicide layer and the graphene conductive structure are disposed in the cell region. In an embodiment, the peripheral circuit region of the semiconductor device includes a second source/drain region disposed in the semiconductor substrate, a second silicide layer disposed in the semiconductor substrate and over the second source/drain region, and a metal conductive structure disposed over the second silicide layer.

In another embodiment of the present disclosure, a semiconductor device is provided. The semiconductor device includes a first source/drain region and a second source/drain region disposed in a semiconductor substrate. The first source/drain region is disposed in a cell region, and the second source/drain region is disposed in a peripheral circuit region. The semiconductor device also includes a first gate structure and a second gate structure disposed over the semiconductor substrate and in the cell region. The first source/drain region is between the first gate structure and the second gate structure. The semiconductor device further includes a graphene conductive structure disposed in the cell region and over the first source/drain region, and a first metal conductive structure disposed in the peripheral circuit region and over the second source/drain region.

In an embodiment, the semiconductor device further includes a barrier layer separating the graphene conductive structure from the first dielectric layer and the second dielectric layer. In an embodiment, the semiconductor device further includes a first silicide layer disposed between the graphene conductive structure and the first source/drain region, wherein the graphene conductive structure is in direct contact with the first silicide layer. In addition, the semiconductor device includes a second silicide layer disposed between the first metal conductive structure and the second source/drain region. In an embodiment, the semiconductor device further includes a third source/drain region disposed in the semiconductor substrate and in the peripheral circuit region, a third silicide layer disposed over the third source/drain region, and a second metal conductive structure disposed in the peripheral circuit region and over the third silicide layer, wherein the first metal conductive structure and the second metal conductive structure are made of tungsten.

In an embodiment, the semiconductor device further includes a first dielectric layer surrounding respective lower portions of the graphene conductive structure, the first metal conductive structure and the second metal conductive structure, and a second dielectric layer surrounding respective upper portions of the graphene conductive structure, the first metal conductive structure and the second metal conductive structure. In an embodiment, the graphene conductive structure comprises a first graphene conductor and a second graphene conductor bonded onto the first graphene conductor, the first graphene conductor is surrounded by and in direct contact with the first dielectric layer, and the second graphene conductor is surrounded by and in direct contact with the second dielectric layer.

In yet another embodiment of the present disclosure, a semiconductor device is provided. The semiconductor device includes a first semiconductor die, and a second semiconductor die bonded to the first semiconductor die. The first semiconductor die includes a semiconductor substrate, a first source/drain region disposed in the semiconductor substrate, and a first silicide layer disposed in the semiconductor substrate and over the first source/drain region. The first semiconductor die also includes a gate structure disposed over the first semiconductor substrate and adjacent to the first source/drain region, and a first dielectric layer disposed over the first semiconductor substrate and surrounding the gate structure. The second semiconductor die includes a second dielectric layer facing the first dielectric layer of the first semiconductor die. The semiconductor die also includes a graphene conductive structure penetrating through the first dielectric layer of the first semiconductor die and the second dielectric layer of the second semiconductor die. The graphene conductive structure is electrically connected to the first silicide layer.

In an embodiment, the graphene conductive structure is in direct contact with the first dielectric layer of the first semiconductor die and the second dielectric layer of the second semiconductor die. In an embodiment, the gate conductive structure comprises a first graphene conductor and a second graphene conductor bonded onto the first graphene conductor, the first graphene conductor is surrounded by the first dielectric layer of the first semiconductor die, and the second graphene conductor is surrounded by the second dielectric layer of the second semiconductor die. In an embodiment, the semiconductor device comprises a cell region and a peripheral circuit region adjacent to the cell region, and wherein the first source/drain region, the first silicide layer, the gate structure and the graphene conductive structure are disposed in the cell region.

In an embodiment, the peripheral circuit region of the semiconductor device includes a second source/drain region and a second silicide layer disposed in the semiconductor substrate of the first semiconductor die, wherein the second silicide layer is disposed over the second source/drain region. In addition, the peripheral circuit region of the semiconductor device includes a metal conductive structure surrounded by the first dielectric layer of the first semiconductor die and the second dielectric layer of the second semiconductor die. In an embodiment, the metal conductive structure comprises a first metal conductor in the first semiconductor die and a second metal conductor in the second semiconductor die and bonded onto the first metal conductor, and wherein the semiconductor device further includes a first barrier layer separating the first metal conductor and the first dielectric layer of the first semiconductor die, and a second barrier layer separating the second metal conductor and the second dielectric layer of the second semiconductor die. In an embodiment, the first metal conductor of the metal conductive structure is separated from the second silicide layer by the first barrier layer.

Embodiments of a semiconductor device are provided in the disclosure. In some embodiments, the semiconductor device includes a graphene conductive structure in a cell region, and the graphene conductive structure is used as an interconnecting structure. For example, the graphene conductive structure is disposed over a device element (e.g., a source/drain region), and the graphene conductive structure is used to electrically connect the device element to another device element formed over the graphene conductive structure. The graphene conductive structure is configured to lower the resistance of the semiconductor device. Therefore, the operation speed of the semiconductor device may be increased, which significantly improves the overall device performance.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
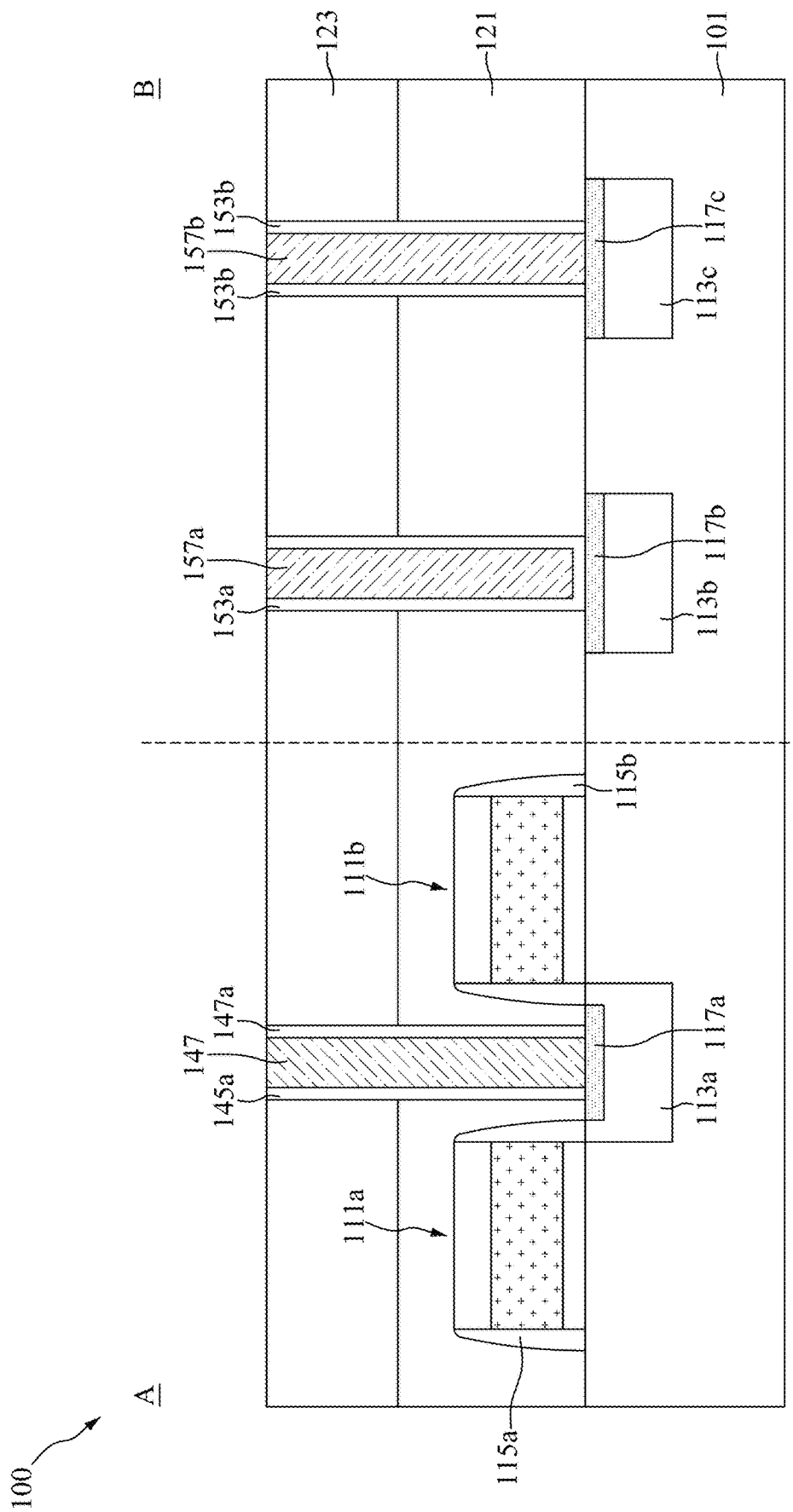
FIG. 1 is a cross-sectional view illustrating a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a cross-sectional view illustrating a semiconductor device 100, in accordance with some embodiments. As shown in FIG. 1, the semiconductor device 100 includes a semiconductor substrate 101, a first dielectric layer 121 disposed above the semiconductor substrate 101, and a second dielectric layer 123 disposed above the first dielectric layer 121. The semiconductor device 100 also includes source/drain regions 113a, 113b, 113c and silicide layers 117a, 117b, 117c disposed in the semiconductor substrate 101, and gate structures 111a, 111b and gate spacers 115a, 115b disposed in the first dielectric layer 121.

The semiconductor device 100 further includes a graphene conductive structure 147 and metal conductive structures 157a, 157b penetrating through the first dielectric layer 121 and the second dielectric layer 123, and barrier layers 145a, 153a, 153b separating the graphene conductive structure 147 and the metal conductive structures 157a, 157b from the first dielectric layer 121 and the second dielectric layer 123. In addition, the semiconductor device 100 includes a cell region A and a peripheral circuit region B adjacent to the cell region A. In some embodiments, the source/drain region 113a, the silicide layer 117a, the gate structures 111a, 111b, the gate spacers 115a, 115b, the graphene conductive structure 147 and the barrier layer 145a are in the cell region A, and the source/drain regions 113b, 113c, the silicide layers 117b, 117c, the metal conductive structures 157a, 157b and the barrier layers 153a, 153b are in the peripheral circuit region B.

In the cell region A, the graphene conductive structure 147 is disposed between the gate structures 111a and 111b, and the graphene conductive structure 147 is electrically connected to the source/drain region 113a through the silicide layer 117a, in accordance with some embodiments. Although only one graphene conductive structure 147 is illustrated, it is understood that more than one graphene conductive structure 147 may be implemented in the cell region A of the semiconductor device 100. In some embodiments, the semiconductor device 100 is a dynamic random access memory (DRAM), and the graphene conductive structure 147 serves as a bit line (BL) contact or a capacitor contact for the DRAM.

In the peripheral circuit region B, the metal conductive structure 157a is electrically connected to the source/drain region 113b through the silicide layer 117b and the barrier layer 153a, and the metal conductive structure 157b is electrically connected to the source/drain region 113c through the silicide layer 117c, in accordance with some embodiments. Although only two metal conductive structures 157a and 157b are illustrated, it is understood that more than two metal conductive structures 157a and 157b may be implemented in the peripheral circuit region B of the semiconductor device 100. Moreover, the first dielectric layer 121 surrounds respective lower portions of the graphene conductive structure 147 and the metal conductive structures 157a, 157b, and the second dielectric layer 123 surrounds respective upper portions of the graphene conductive structure 147 and the metal conductive structures 157a, 157b, in accordance with some embodiments.

Figure 2:
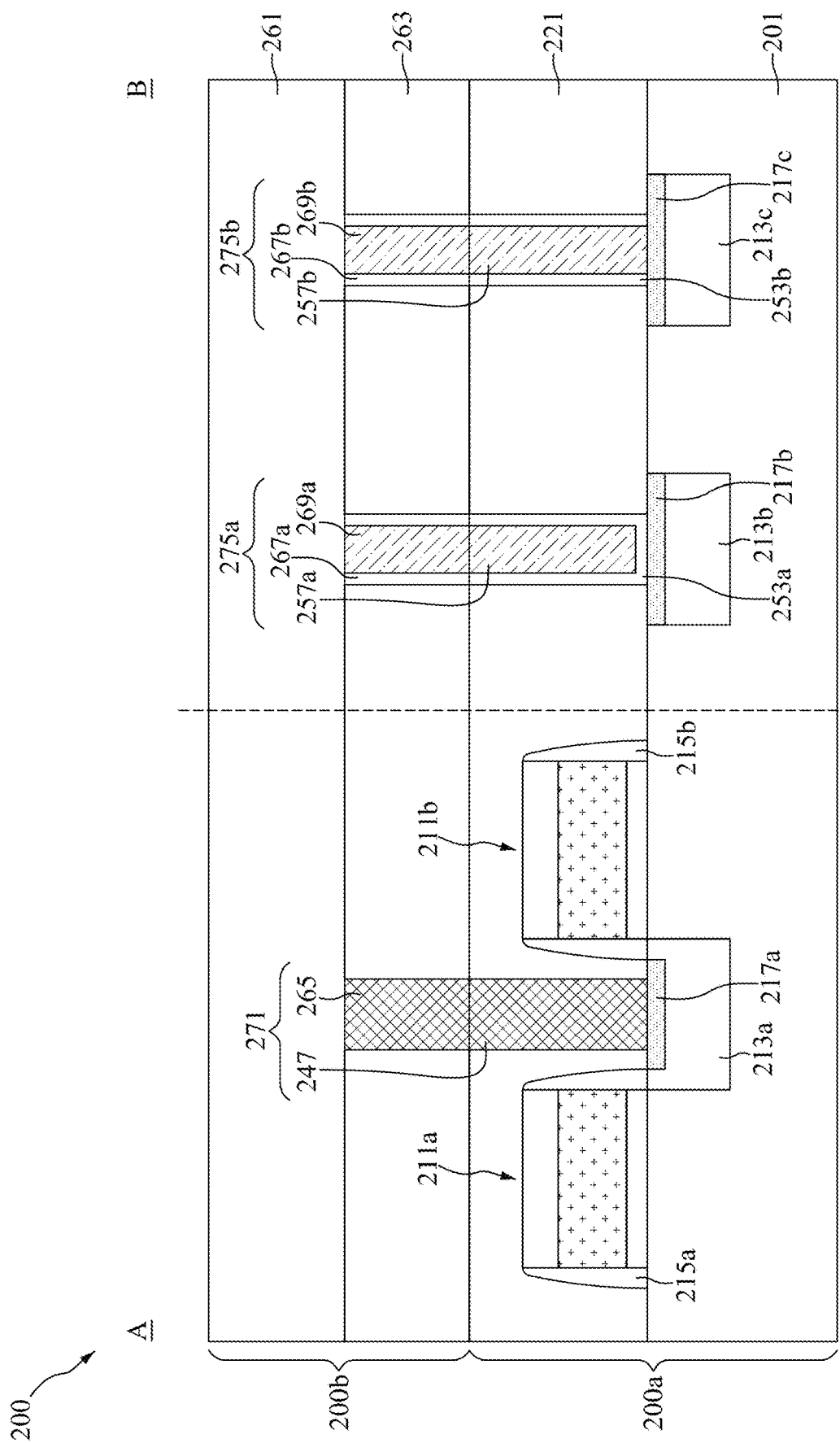
FIG. 2 is a cross-sectional view illustrating a modified semiconductor device, in accordance with some embodiments.

FIG. 2 is a cross-sectional view illustrating a modified semiconductor device 200, which is an alternative embodiment of the semiconductor device 100, in accordance with some embodiments. Like reference numbers refer to the same or similar features and/or materials in FIGS. 1 and 2. As shown in FIG. 2, the semiconductor device 200 includes a first semiconductor die 200a and a second semiconductor die 200b bonded onto the first semiconductor die 200a.

The first semiconductor die 200a includes a first semiconductor substrate 201 and a first dielectric layer 221 disposed over the first semiconductor substrate 201. The first semiconductor die 200a also includes source/drain regions 213a, 213b, 213c and silicide layers 217a, 217b, 217c disposed in the first semiconductor substrate 201, and gate structures 211a, 211b and gate spacers 215a, 215b disposed in the first dielectric layer 221. The first semiconductor die 200a further includes a first graphene conductor 247 and first metal conductors 257a, 257b penetrating through the first dielectric layer 221, and barrier layers 253a, 253b separating the first metal conductors 257a, 257b from the first dielectric layer 221.

The second semiconductor die 200b includes a second semiconductor substrate 261 and a second dielectric layer 263. In some embodiments, the second semiconductor die 200b is bonded onto the first semiconductor die 200a with the second dielectric layer 263 facing the first dielectric layer 221. The second semiconductor die 200b also includes a second graphene conductor 265 and second metal conductors 269a, 269b penetrating through the second dielectric layer 263, and barrier layers 267a, 267b separating the second metal conductors 269a, 269b from the second dielectric layer 263. In some embodiments, the second graphene conductor 265 is bonded onto the first graphene conductor 247 to form a graphene conductive structure 271, and the second metal conductors 269a, 269b are bonded onto the first metal conductors 257a, 257b to form metal conductive structures 275a, 275b, respectively.

Similar to the semiconductor device 100, the semiconductor device 200 includes a cell region A and a peripheral circuit region B adjacent to the cell region A. In some embodiments, the source/drain region 213a, the silicide layer 217a, the gate structures 211a, 211b, the gate spacers 215a, 215b, and the graphene conductive structure 271 (including the first graphene conductor 247 and the second graphene conductor 265) are in the cell region A. In addition, the source/drain regions 213b, 213c, the silicide layers 217b, 217c, the metal conductive structures 275a, 275b (including the first metal conductors 257a, 257b and the second metal conductors 269a, 269b) and the barrier layers 253a, 253b, 267a, 267b are in the peripheral circuit region B.

In the cell region A, the first dielectric layer 221 of the first semiconductor die 200a and the second dielectric layer 263 of the second semiconductor die 200b surround and in direct contact with the graphene conductive structure 271, and the graphene conductive structure 271 is electrically connected to the source/drain region 213a through the silicide layer 217a, in accordance with some embodiments. Although only one graphene conductive structure 271 is illustrated, it is understood that more than one graphene conductive structure 271 may be implemented in the cell region A of the semiconductor device 200. In some embodiments, the semiconductor device 200 is a dynamic random access memory (DRAM), and the graphene conductive structure 271 serves as a bit line (BL) contact or a capacitor contact for the DRAM.

In the peripheral circuit region B, the metal conductive structure 275a is electrically connected to the source/drain region 213b through the silicide layer 217b and the barrier layer 253a, and the metal conductive structure 275b is electrically connected to the source/drain region 213c through the silicide layer 217c, in accordance with some embodiments. Although only two metal conductive structures 275a and 275b are illustrated, it is understood that more than two metal conductive structures 275a and 275b may be implemented in the peripheral circuit region B of the semiconductor device 200.

Figure 3:
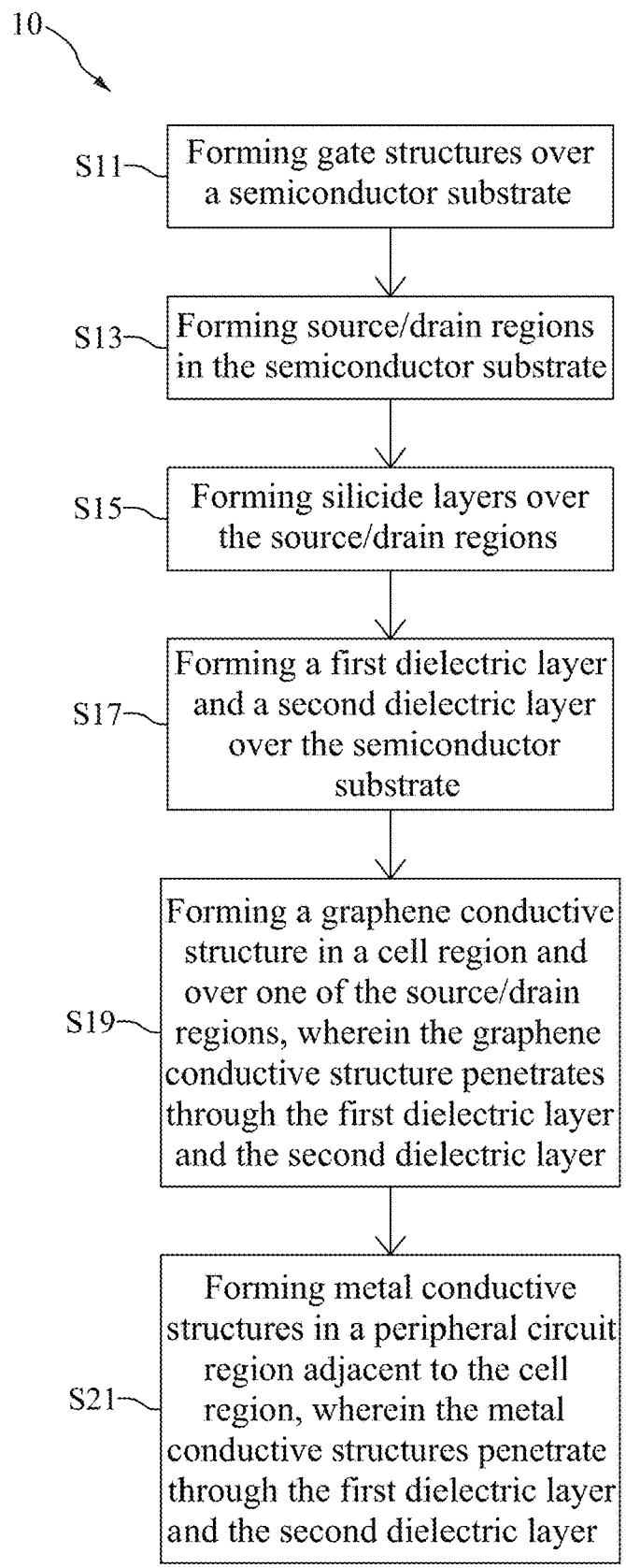
FIG. 3 is a flow diagram illustrating a method for forming a semiconductor device, in accordance with some embodiments.
Figure 4:
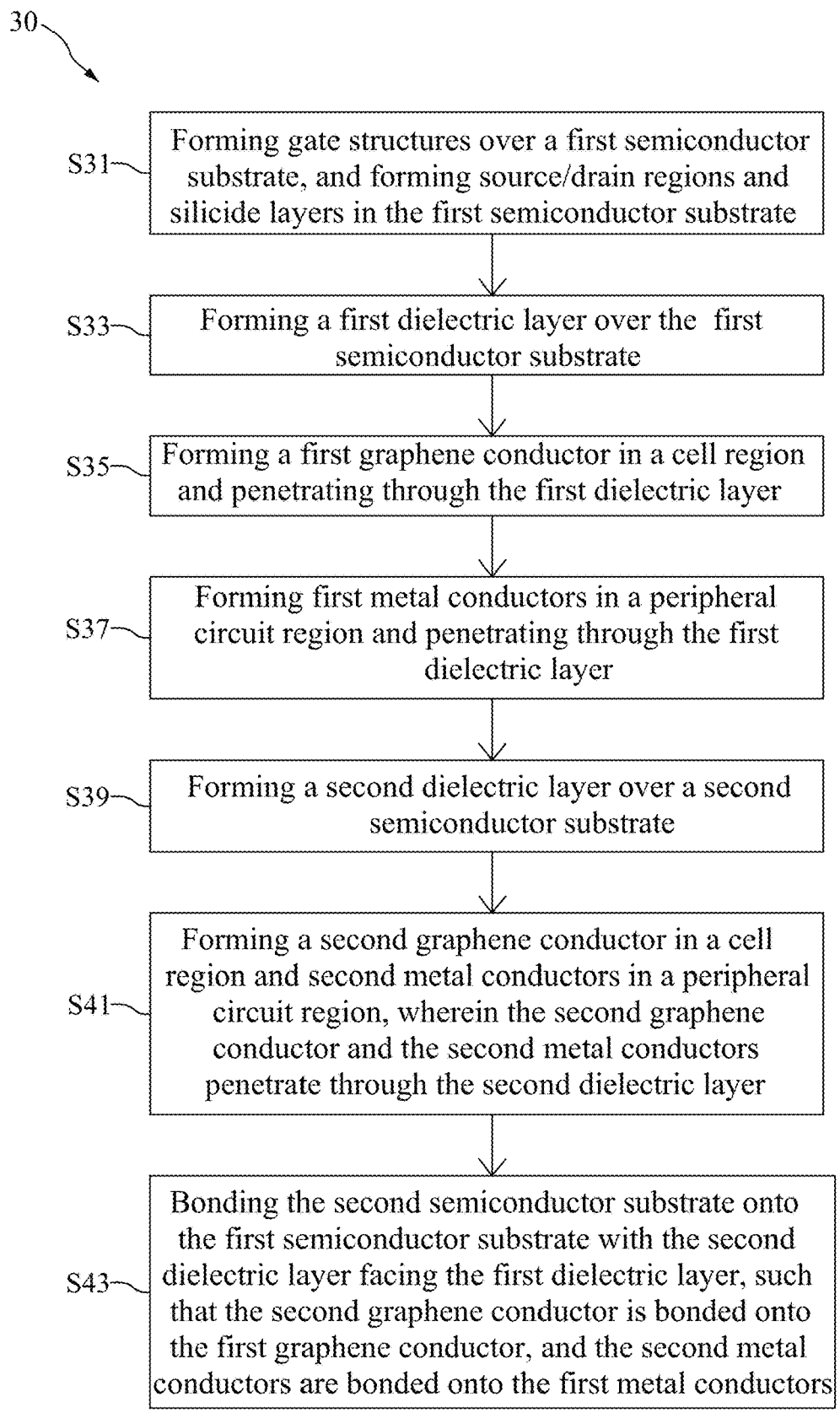
FIG. 4 is a flow diagram illustrating a method for forming a modified semiconductor device, in accordance with some embodiments.

FIG. 3 is a flow diagram illustrating a method 10 of forming the semiconductor device 100, and the method 10 includes steps S11, S13, S15, S17, S19 and S21, in accordance with some embodiments. FIG. 4 is a flow diagram illustrating a method 30 of forming the semiconductor device 200, and the method 30 includes steps S31, S33, S35, S37, S39, S41 and S43, in accordance with some embodiments. The steps S11 to S21 of FIG. 3 and the steps S31 to S43 of FIG. 4 are elaborated in connection with the following figures.

Figure 5:
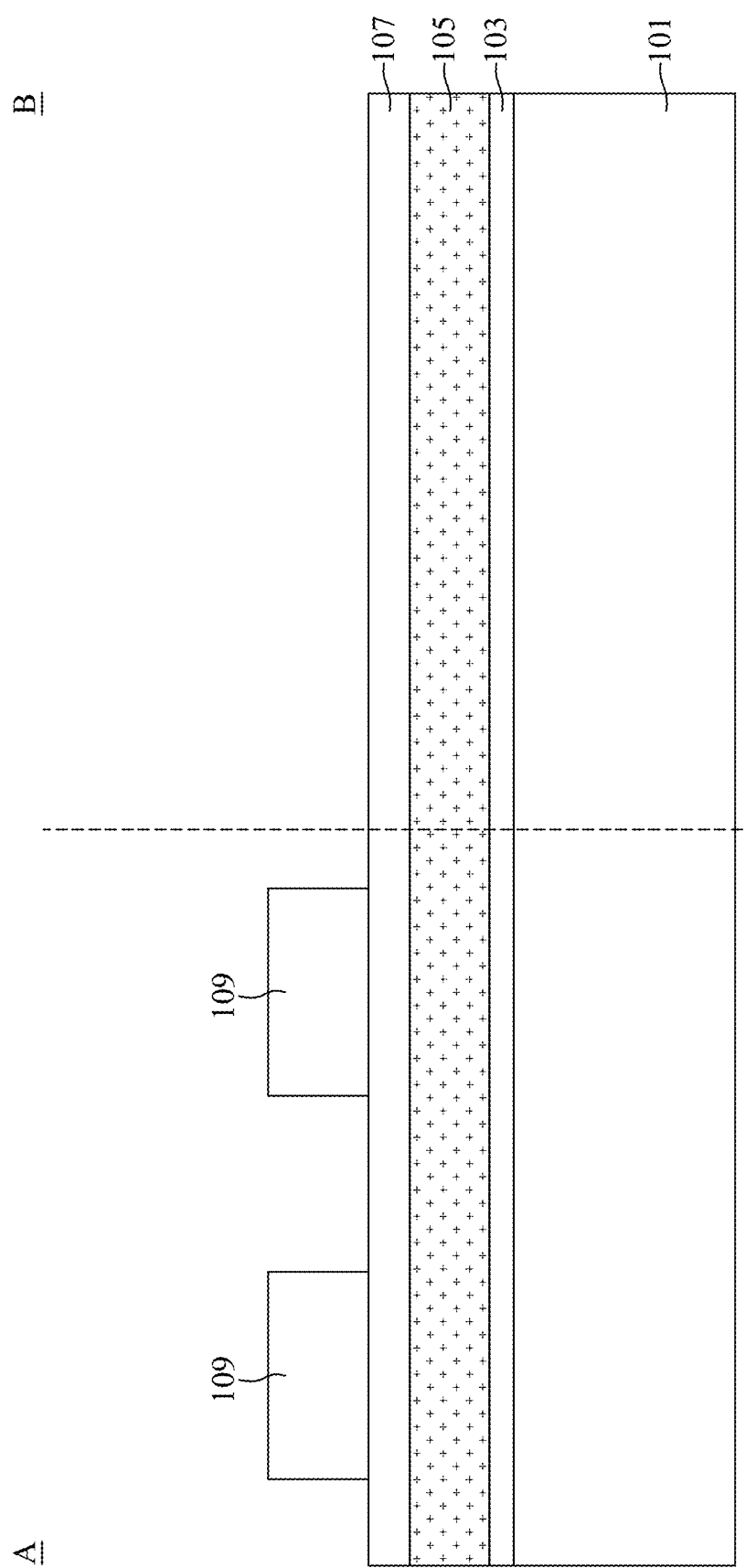
FIG. 5 is a cross-sectional view illustrating an intermediate stage of forming a patterned mask during the formation of the semiconductor device, in accordance with some embodiments.

FIGS. 5 to 17 are cross-sectional views illustrating intermediate stages of forming the semiconductor device 100, in accordance with some embodiments. As shown in FIG. 5, the semiconductor substrate 101 is provided. The semiconductor substrate 101 may be a semiconductor wafer such as a silicon wafer.

Alternatively or additionally, the semiconductor substrate 101 may include elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP.

In some embodiments, the semiconductor substrate 101 includes an epitaxial layer. For example, the semiconductor substrate 101 has an epitaxial layer overlying a bulk semiconductor. In some embodiments, the semiconductor substrate 101 is a semiconductor-on-insulator substrate which may include a substrate, a buried oxide layer over the substrate, and a semiconductor layer over the buried oxide layer, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other applicable methods.

Still referring to FIG. 5, a gate dielectric material 103, a gate electrode material 105 and a gate capping material 107 are sequentially formed over the semiconductor substrate 101, and a patterned mask 109 is formed over the gate capping material 107. In some embodiments, the gate dielectric material 103, the gate electrode material 105 and the gate capping material 107 extend from the cell region A to the peripheral circuit region B, and the patterned mask 109 is formed in the cell region A.

In some embodiments, the gate dielectric material 103 is made of silicon oxide, silicon carbide, silicon nitride, silicon oxynitride, a dielectric material with high dielectric constant (high-k), or a combination thereof, the gate electrode material 105 is made of polysilicon, a metal material (e.g., aluminum (Al), copper (Cu), tungsten (W), titanium (Ti), tantalum (Ta)), a metal silicide material, or a combination thereof, and the gate capping material 107 is made of silicon oxide, silicon carbide, silicon nitride, silicon oxynitride, or another applicable material. Moreover, the formations of the gate dielectric material 103, the gate electrode material 105 and the gate capping material 107 may include a thermal oxidation process, a chemical vapor deposition (CVD) process, a physical vapor deposition (PVD) process, an atomic layer deposition (ALD) process, a spin-on coating process, or a another applicable process.

Figure 6:
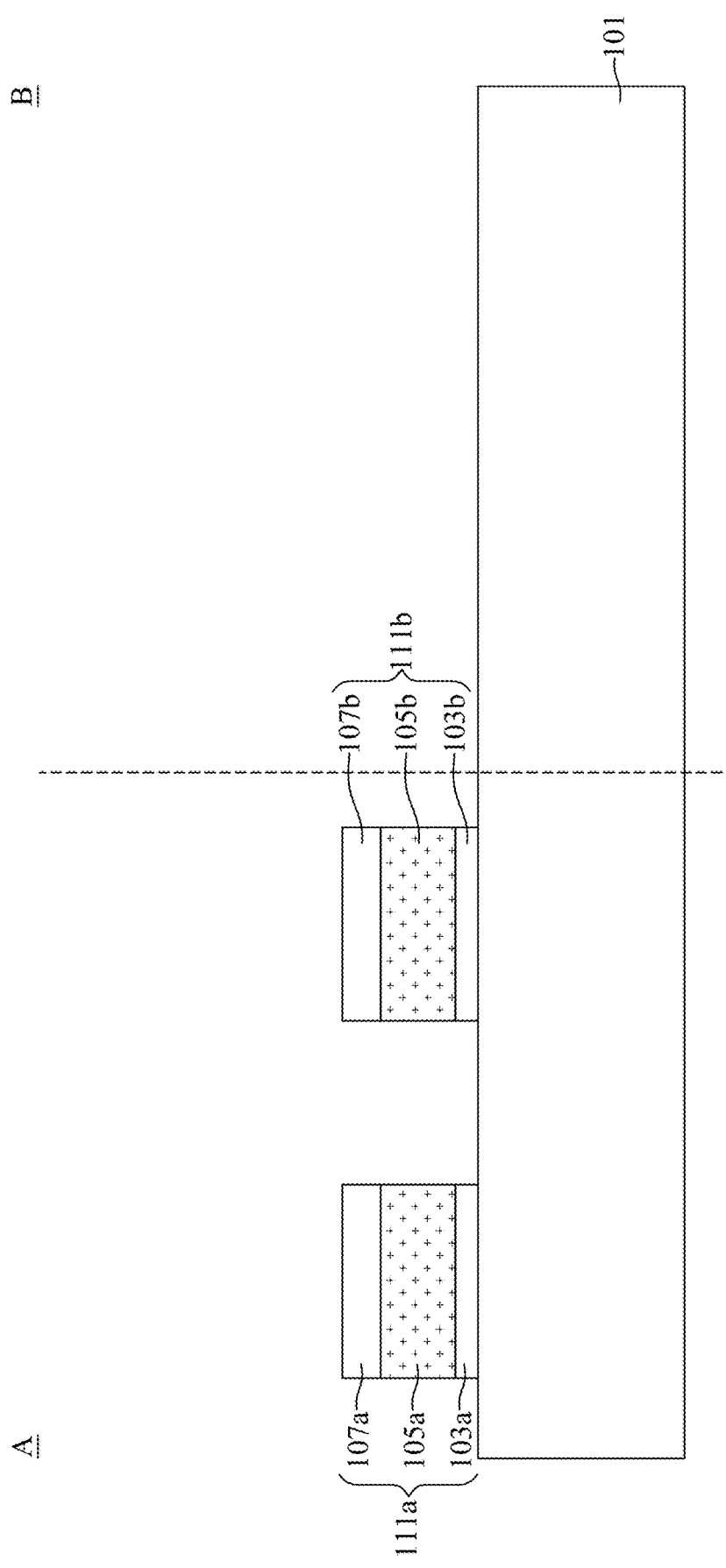
FIG. 6 is a cross-sectional view illustrating an intermediate stage of forming gate structures during the formation of the semiconductor device, in accordance with some embodiments.

Next, the gate dielectric material 103, the gate electrode material 105 and the gate capping material 107 are etched by using the patterned mask 109 as a mask, such that gate structures 111a and 111b are formed, as shown in FIG. 6 in accordance with some embodiments. The respective step is illustrated as the step S11 in the method 10 shown in FIG. 3.

In some embodiments, the gate structure 111a includes a gate dielectric layer 103a, a gate electrode layer 105a and a gate capping layer 107a, and the gate structure 111b includes a gate dielectric layer 103b, a gate electrode layer 105b and a gate capping layer 107b. Moreover, the gate structures 111a and 111b may be formed by a wet etching process, a dry etching process, or a combination thereof. After the gate structures 111a and 111b are obtained, the patterned mask 109 can be removed.

Figure 7:
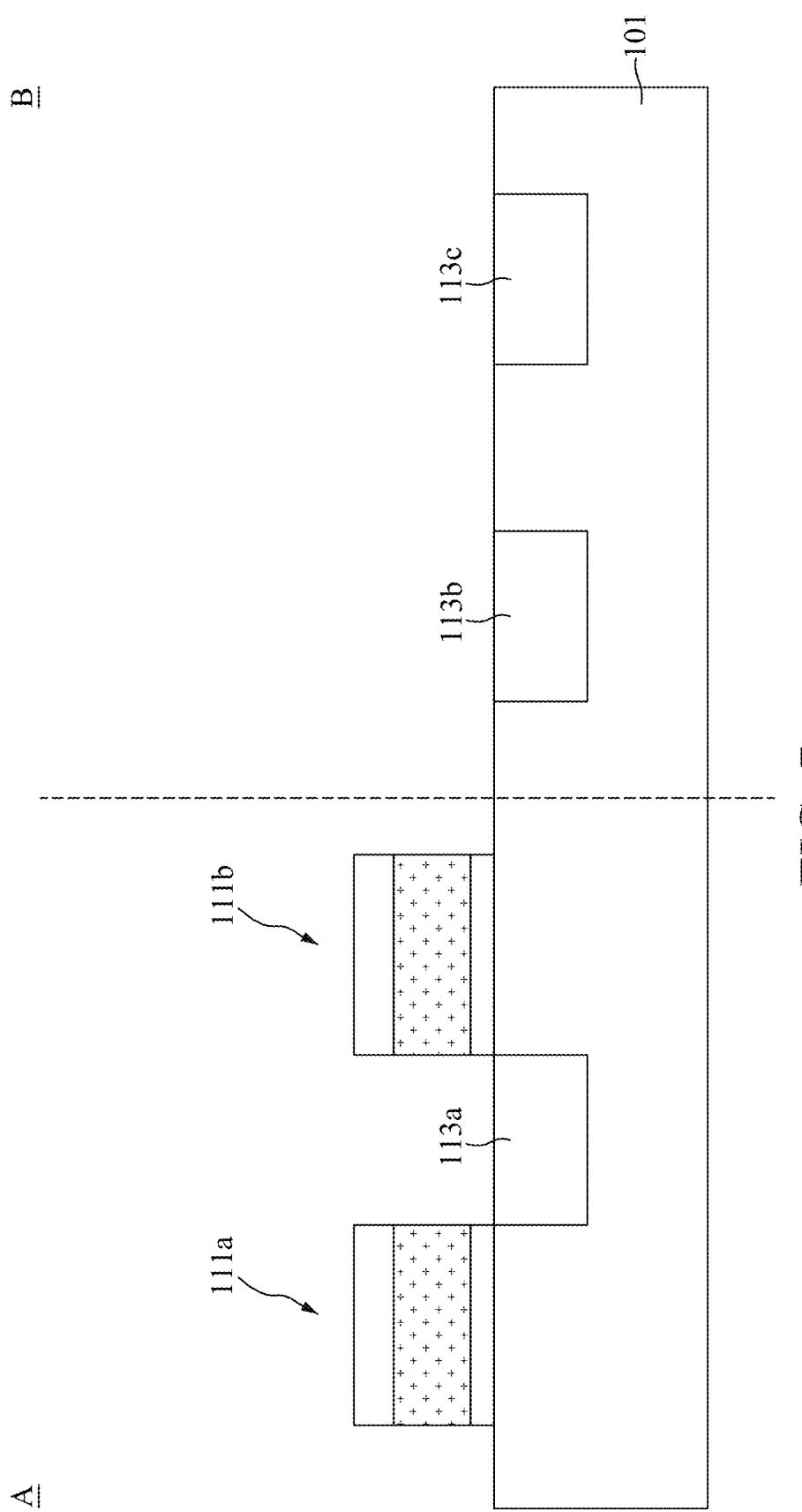
FIG. 7 is a cross-sectional view illustrating an intermediate stage of forming source/drain regions during the formation of the semiconductor device, in accordance with some embodiments.

After the gate structures 111a and 111b are formed, source/drain regions 113a, 113b, 113c are formed in the semiconductor substrate 101, as shown in FIG. 7 in accordance with some embodiments. The respective step is illustrated as the step S13 in the method 10 shown in FIG. 3. In some embodiments, the source/drain region 113a is in the cell region A, and the source/drain region 113b and 113c are in the peripheral circuit region B.

In some embodiments, the source/drain region 113a is adjacent to and between the gate structures 111a and 111b. In some embodiments, the source/drain regions 113a, 113b, 113c are formed by one or more ion implantation processes, and P-type dopants, such as boron (B), gallium (Ga), or indium (In), or N-type dopants, such as phosphorous (P) or arsenic (As), can be implanted in the semiconductor substrate 101 to form the source/drain regions 113a, 113b, 113c, depending on the conductivity type of the semiconductor device 100.

Figure 8:
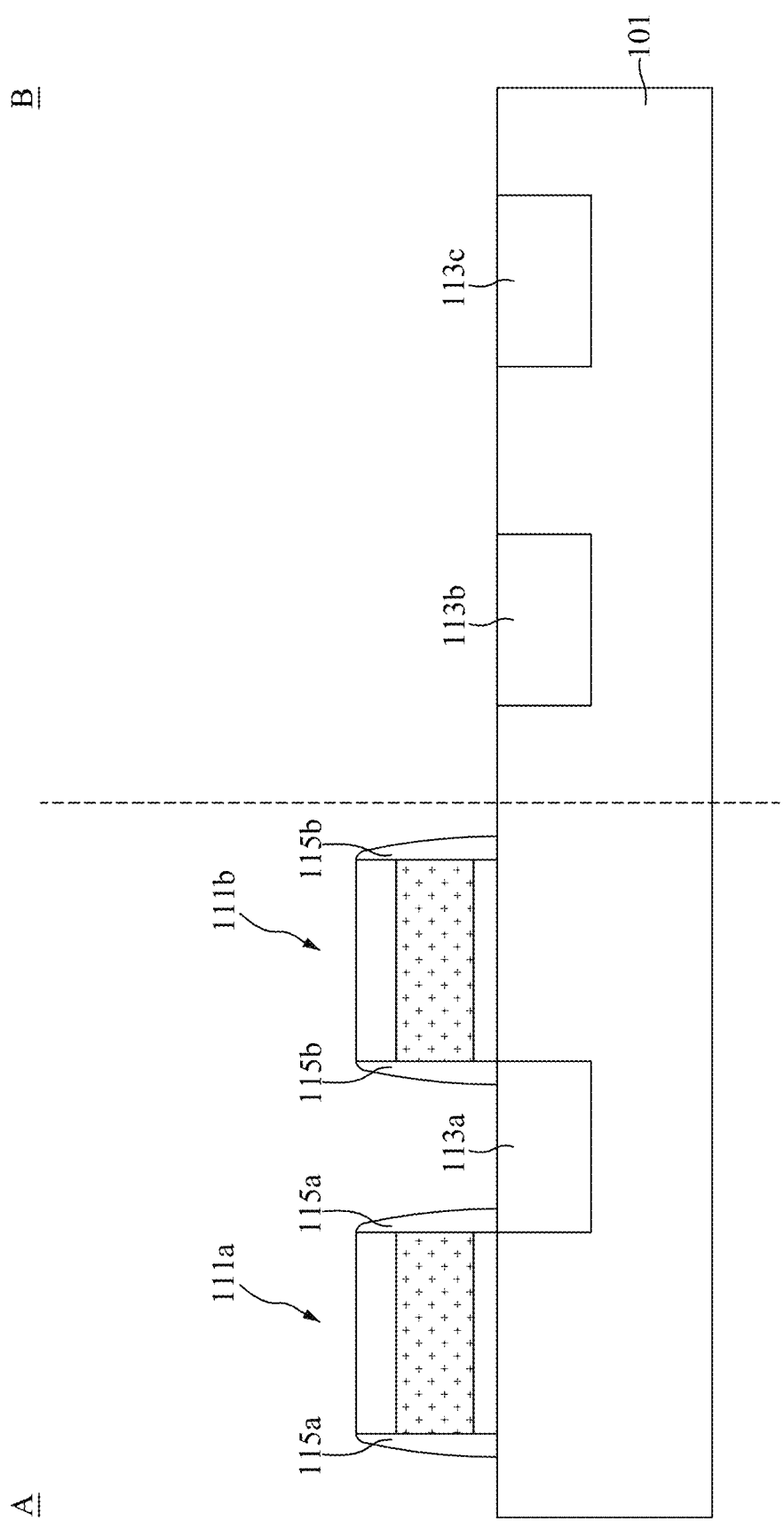
FIG. 8 is a cross-sectional view illustrating an intermediate stage of forming gate spacers during the formation of the semiconductor device, in accordance with some embodiments.

Subsequently, gate spacers 115a and 115b are formed on sidewalls of the gate structures 111a and 111b, respectively, as shown in FIG. 8 in accordance with some embodiments. In some embodiments, the source/drain region 113a is partially covered by the gate spacers 115a and 115b. In some embodiments, the gate spacers 115a and 115b are made of silicon oxide, silicon carbide, silicon nitride, silicon oxynitride, another applicable dielectric material, or a combination thereof.

In some embodiments, the formation of the gate spacers 115a and 115b includes conformally depositing a spacer material (not shown) on the top surfaces and the sidewalls of the gate structures 111a, 111b and on the top surface of the semiconductor substrate 101. The deposition process may include a CVD process, a PVD process, an ALD process, a spin-on coating process, or another applicable process. Then, the spacer material may be etched by an anisotropic etching process, which removes the same amount of the spacer material vertically in all places, leaving the gate spacers 115a, 115b on the sidewalls of the gate structures 111a, 111b. In some embodiments, the etching process is a dry etching process.

Figure 9:
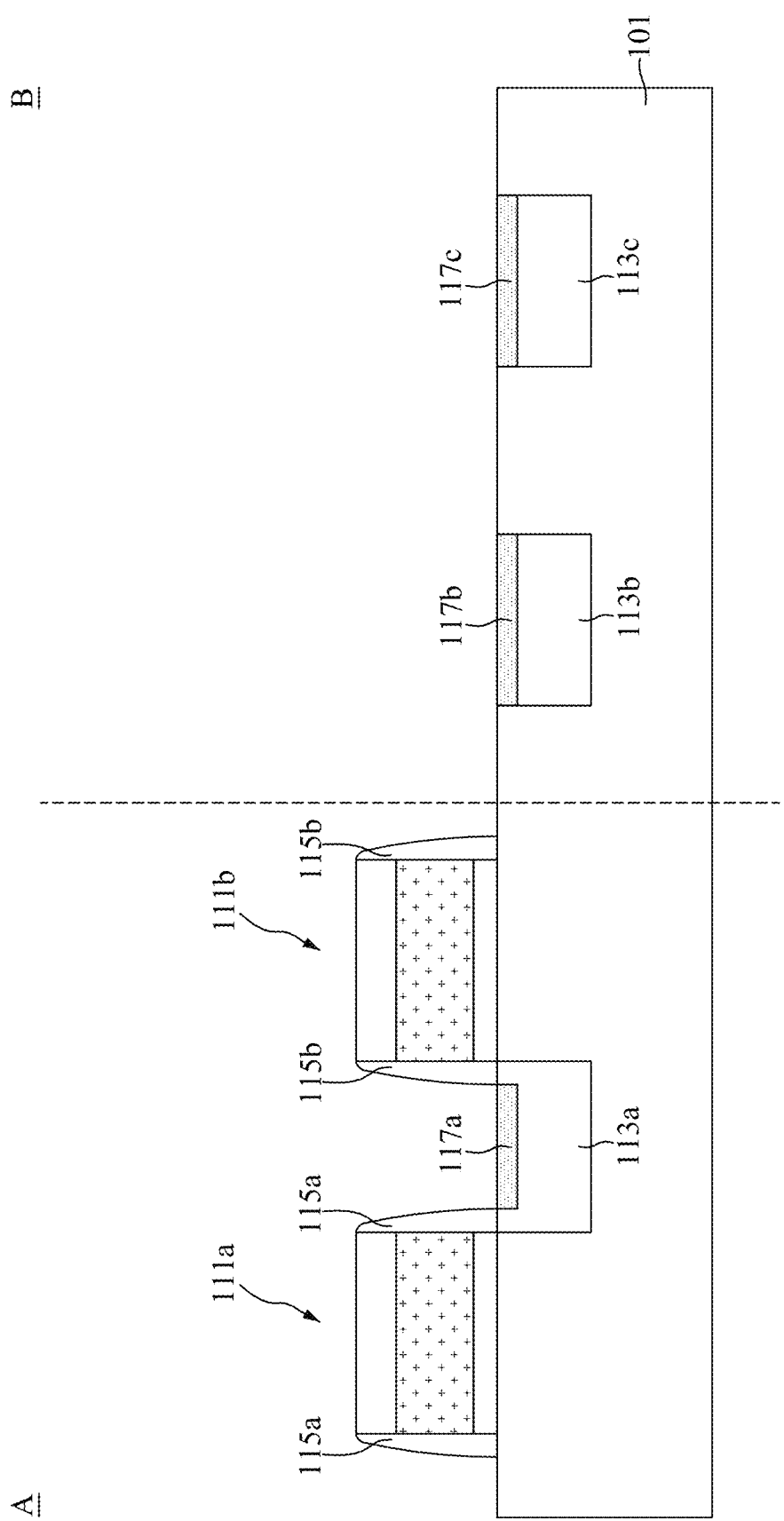
FIG. 9 is a cross-sectional view illustrating an intermediate stage of forming silicide layers during the formation of the semiconductor device, in accordance with some embodiments.

After the gate spacers 115a, 115b are formed, silicide layers 117a, 117b, 117c are formed over the source/drain regions 113a, 113b, 113c, respectively, as shown in FIG. 9 in accordance with some embodiments. The respective step is illustrated as the step S15 in the method 10 shown in FIG. 3. In some embodiments, the silicide layers 117a, 117b, 117c are formed in the semiconductor substrate 101.

In some embodiments, a metal material (not shown) is conformally formed over the structure of FIG. 8, and then, a thermal process is performed to induce the reaction of the silicon at the semiconductor substrate 101 with the metal material to form silicide layers 117a, 117b, 117c over the source/drain regions 113a, 113b, 113c. The metal material may include titanium (Ti), tungsten (W), cobalt (Co), or a combination thereof, and the temperature of the thermal process may be in a range from about 700° C. to about 750° C. After the reaction, unreacted portions of the metal material can be selectively removed by chemical solution, such as ammonia solution or hydrogen peroxide.

Figure 10:
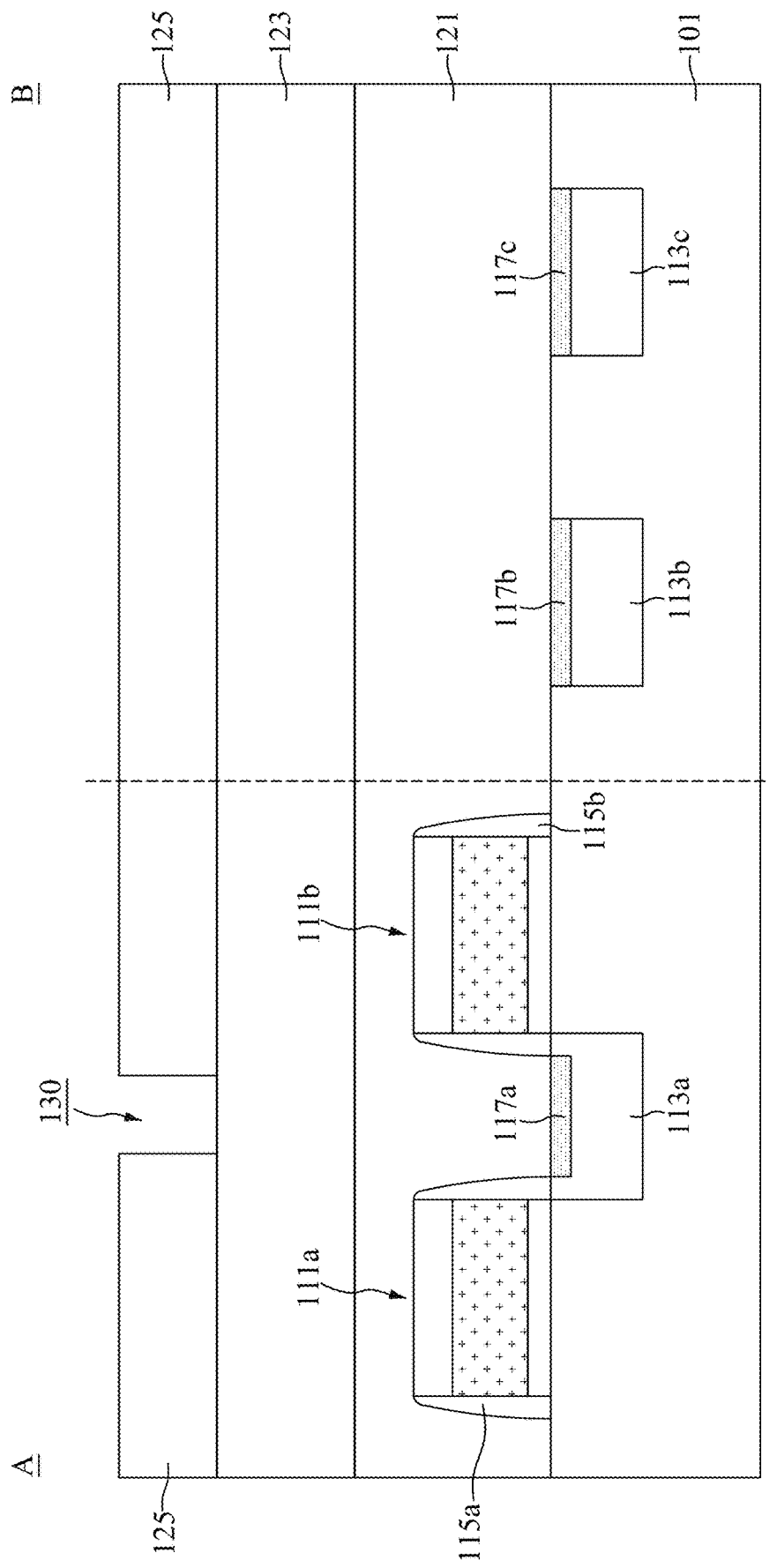
FIG. 10 is a cross-sectional view illustrating an intermediate stage of forming a first dielectric layer and a second dielectric layer during the formation of the semiconductor device, in accordance with some embodiments.

Next, a first dielectric layer 121 and a second dielectric layer 123 are sequentially formed over the semiconductor substrate 101, and a patterned mask 125 with an opening 130 is formed over the second dielectric layer 123, as shown in FIG. 10 in accordance with some embodiments. The respective step is illustrated as the step S17 in the method 10 shown in FIG. 3. In some embodiments, the gate structures 111a, 111b, and the gate spacers 115a, 115b are surrounded by the first dielectric layer 121. In some embodiments, the gate structures 111a, 111b, and the gate spacers 115a, 115b are covered by the first dielectric layer 121.

In some embodiments, the first dielectric layer 121 includes multilayers made of multiple dielectric materials, such as silicon oxide, silicon nitride, silicon oxynitride, tetraethoxysilane (TEOS) oxide, phosphosilicate glass (PSG), borophosphosilicate glass (BPSG), low-k dielectric material, and/or other applicable dielectric materials. The first dielectric layer 121 may be formed by a CVD process, a PVD process, an ALD process, a spin-on coating process, or another applicable process. Some materials and processes used to form the second dielectric layer 123 are similar to, or the same as those used to form the first dielectric layer 121, and details thereof are not repeated herein.

In some embodiments, the first dielectric layer 121 and the second dielectric layer 123 are made of different materials. For example, the first dielectric layer 121 is made of BPSG, and the second dielectric layer 123 is made of TEOS oxide. In addition, the opening 130 of the patterned mask 125 is in the cell region A and directly above the silicide layer 117a, in accordance with some embodiments.

Figure 11:
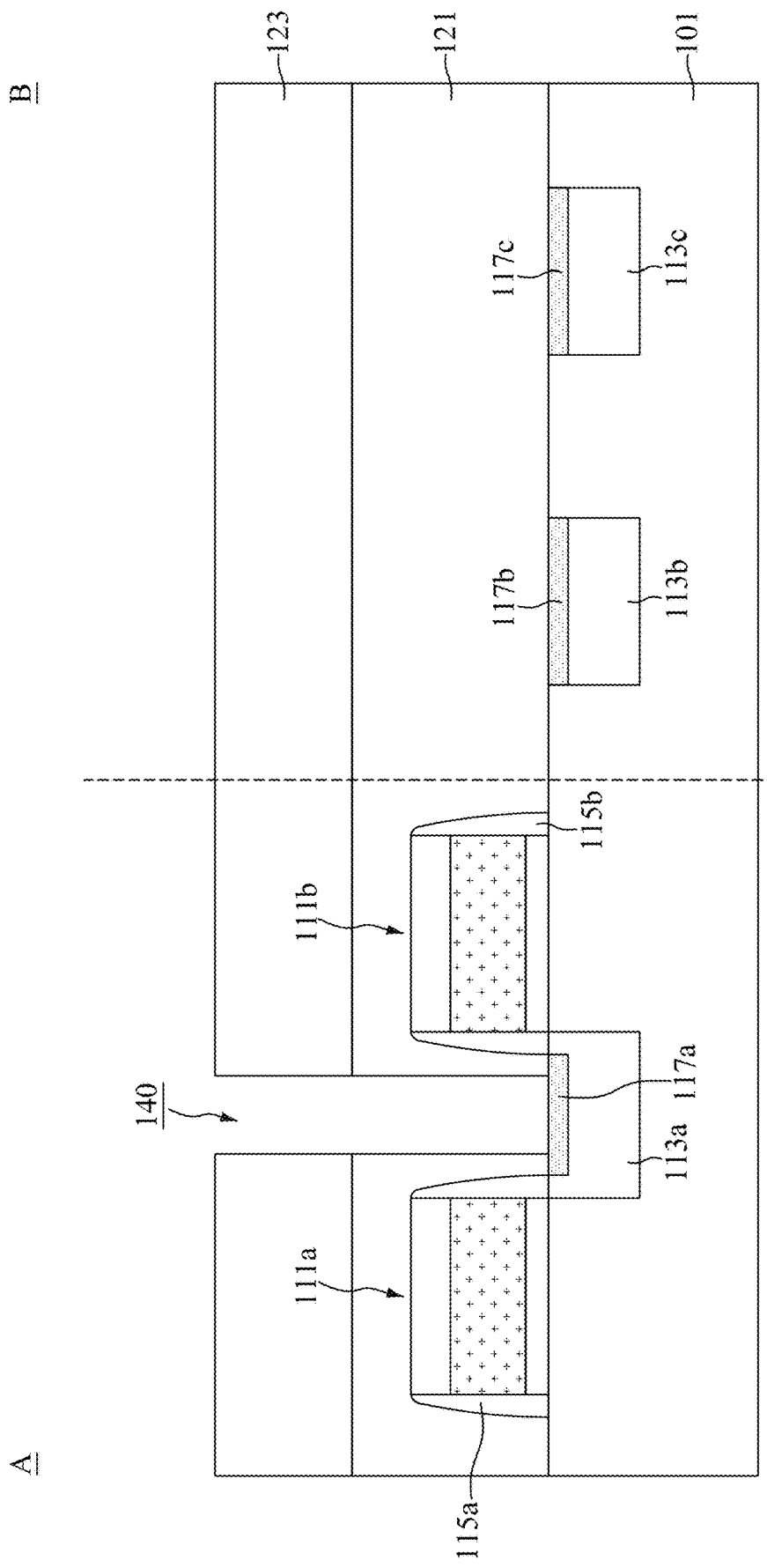
FIG. 11 is a cross-sectional view illustrating an intermediate stage of etching the first dielectric layer and the second dielectric layer to form an opening in a cell region during the formation of the semiconductor device, in accordance with some embodiments.

Subsequently, the first dielectric layer 121 and the second dielectric layer 123 are etched by using the patterned mask 125 as a mask, such that the silicide layer 117a is partially exposed by an opening 140, as shown in FIG. 11 in accordance with some embodiments. In some embodiments, the opening 140 penetrates through the first dielectric layer 121 and the second dielectric layer 123. The opening 140 may be formed by a wet etching process, a dry etching process, or a combination thereof. After the opening 140 is obtained, the patterned mask 125 may be removed.

Figure 12:
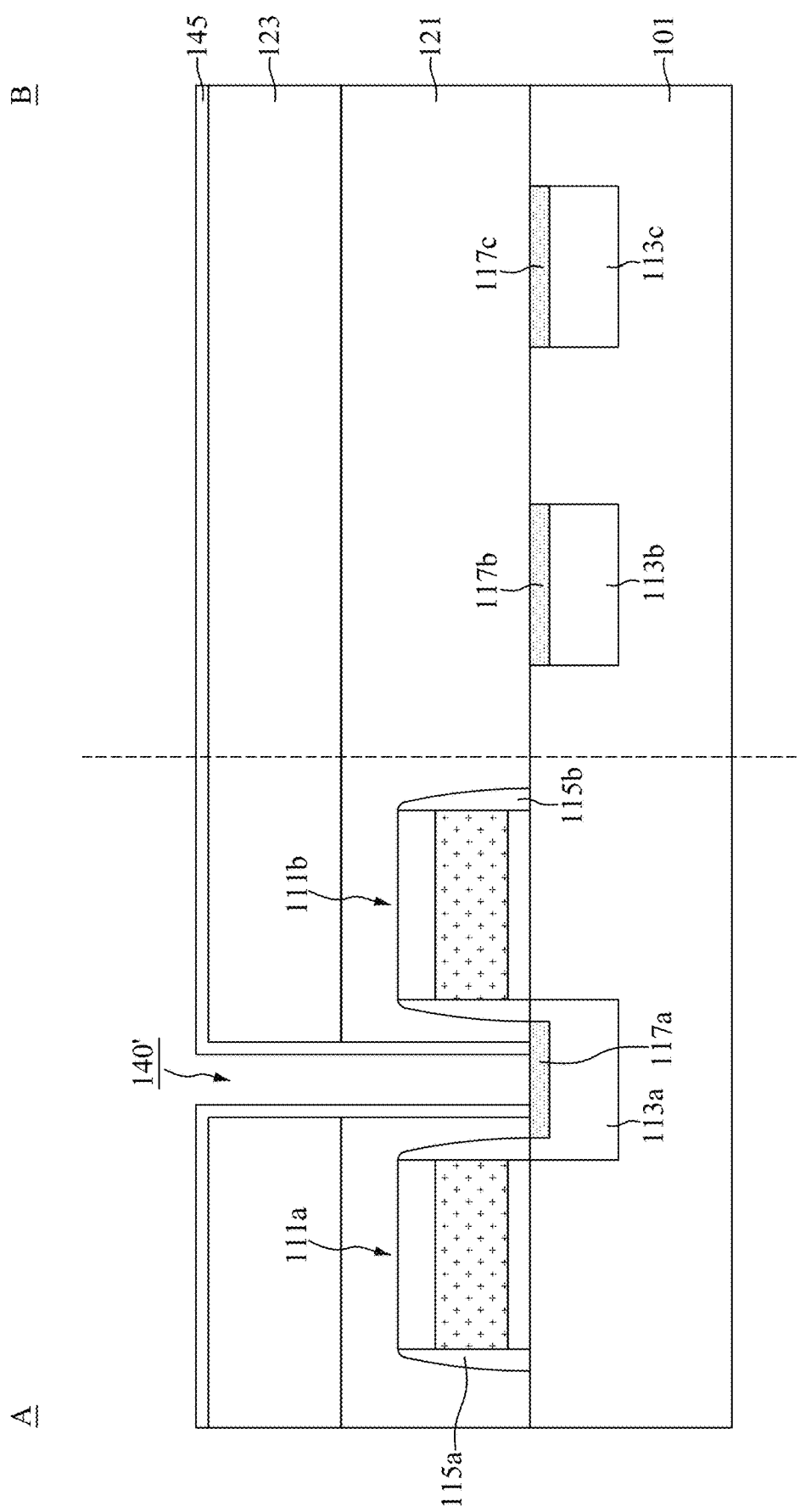
FIG. 12 is a cross-sectional view illustrating an intermediate stage of forming a barrier material lining the opening in the cell region during the formation of the semiconductor device, in accordance with some embodiments.

After the silicide layer 117a is partially exposed, a barrier material 145 is conformally deposited over the structure of FIG. 11, as shown in FIG. 12 in accordance with some embodiments. In some embodiments, the barrier material 145 is formed over the top surface of the second dielectric layer 123 and lining the sidewalls and the bottom surface of the opening 140, such that a reduced opening 140' is obtained. In some embodiments, the exposed portion of the silicide layer 117a is covered by the barrier material 145.

In some embodiments, the barrier material 145 is made of titanium (Ti), titanium nitride (TiN), tantalum (Ta), tantalum nitride (TaN), cobalt tungsten (CoW), another applicable material, or a combination thereof. Moreover, the barrier material 145 may be formed by a CVD process, a PVD process, an ALD process, a metal organic CVD (MOCVD) process, a sputtering process, a plating process, or another applicable process.

Figure 13:
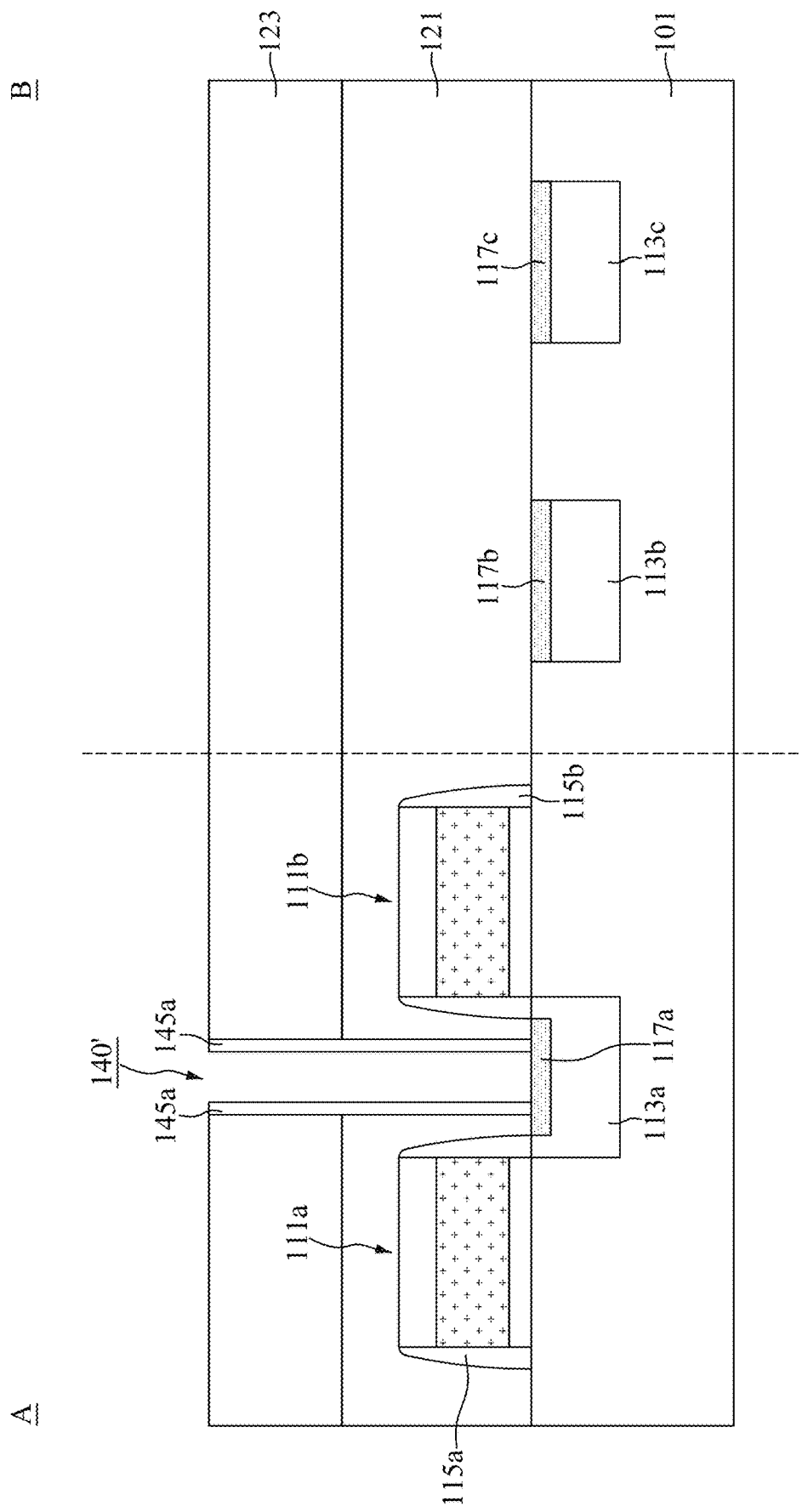
FIG. 13 is a cross-sectional view illustrating an intermediate stage of etching the barrier material in the cell region during the formation of the semiconductor device, in accordance with some embodiments.

Then, an etching process is performed on the barrier material 145 to remove the portion of the barrier material 145 covering the top surface of the second dielectric layer 123 and the portion of the barrier material 145 covering the top surface of the silicide layer 117a, as shown in FIG. 13 in accordance with some embodiments. In some embodiments, a barrier layer 145a is obtained after the etching process, and the barrier layer 145a is the remaining portion of the barrier material 145 on the sidewalls of the first dielectric layer 121 and the second dielectric layer 123. The etching process may be an anisotropic etching process, such as a reactive ion etching (RIE) process.

Figure 14:
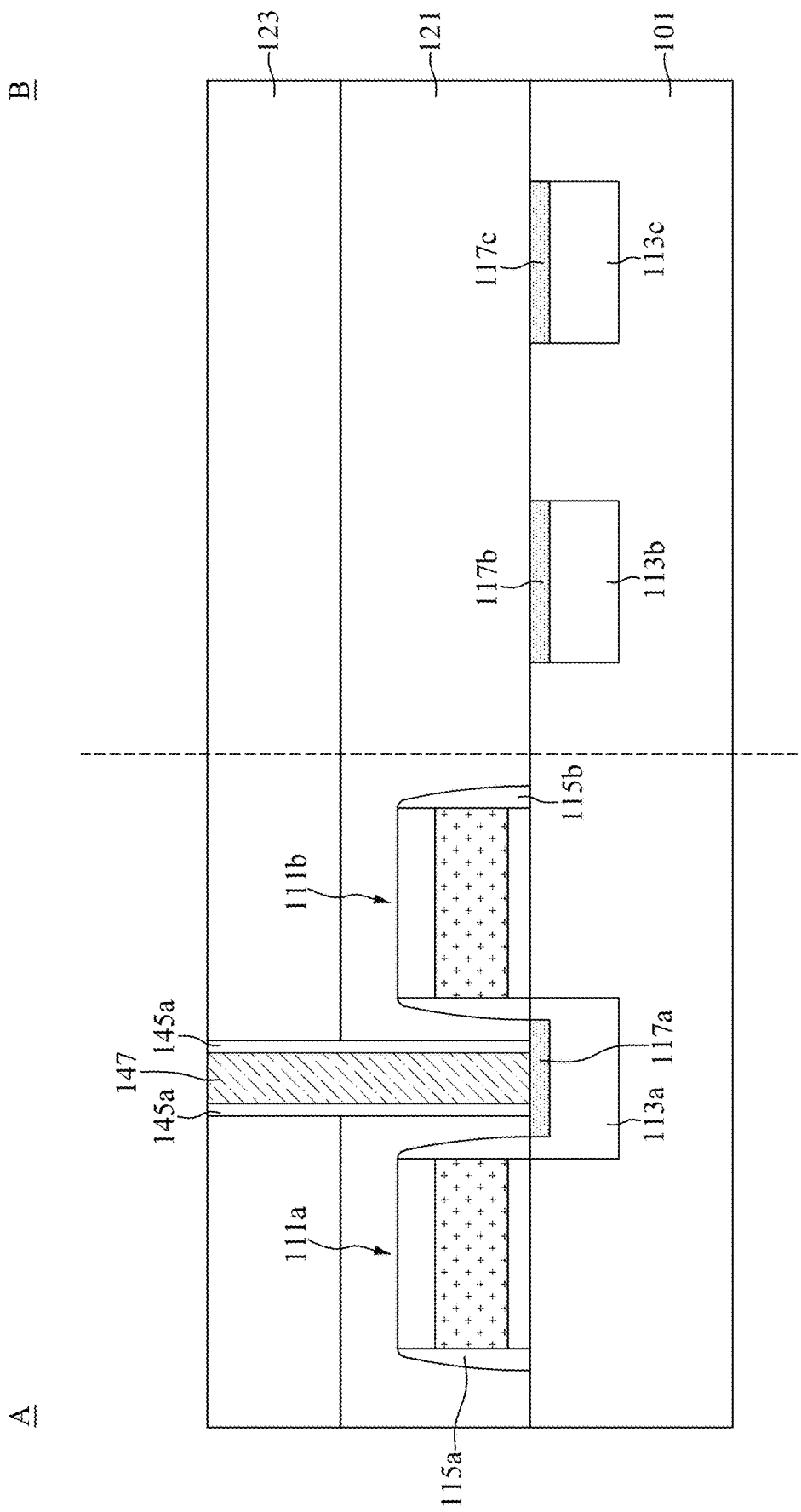
FIG. 14 is a cross-sectional view illustrating an intermediate stage of forming a graphene conductive structure in the cell region during the formation of the semiconductor device, in accordance with some embodiments.

After the barrier layer 145a is formed, a graphene conductive structure 147 is formed in the reduced opening 140', as shown in FIG. 14 in accordance with some embodiments. The respective step is illustrated as the step S19 in the method 10 shown in FIG. 3. In some embodiments, the graphene conductive structure 147 is in the cell region A and located over the source/drain region 113a. In some embodiments, the graphene conductive structure 147 is in direct contact with the barrier layer 145a and the silicide layer 117a.

In some embodiments, the graphene conductive structure 147 is formed by a CVD process, an ALD process, a plasma-enhanced CVD process, or a plasma-enhanced ALD process. For example, in the CVD process or the plasma-enhanced CVD process, the reactant gas used for forming the graphene conductive structure 147 may include $C_xH_y$ and $H_2$, a flow rate of the reactant gas may be in a range from about 100 sccm to about 1000 sccm, a process pressure may be in a range from about 0.1 torr to about 760 torr, and a process temperature may be in a range from about 25° C. to about 1000° C., such as in a range from about 25° C. to about 425° C.

In the plasma enhanced CVD process, a plasma power may be in a range from about 50 W to about 1000 W. Since graphene is a low-resistance conductive material, resistive-capacitive (RC) delay of signals transmitted through the device elements (e.g., the source/drain region 113a and the device element (not shown) over the graphene conductive structure 147) can be reduced.

Figure 15:
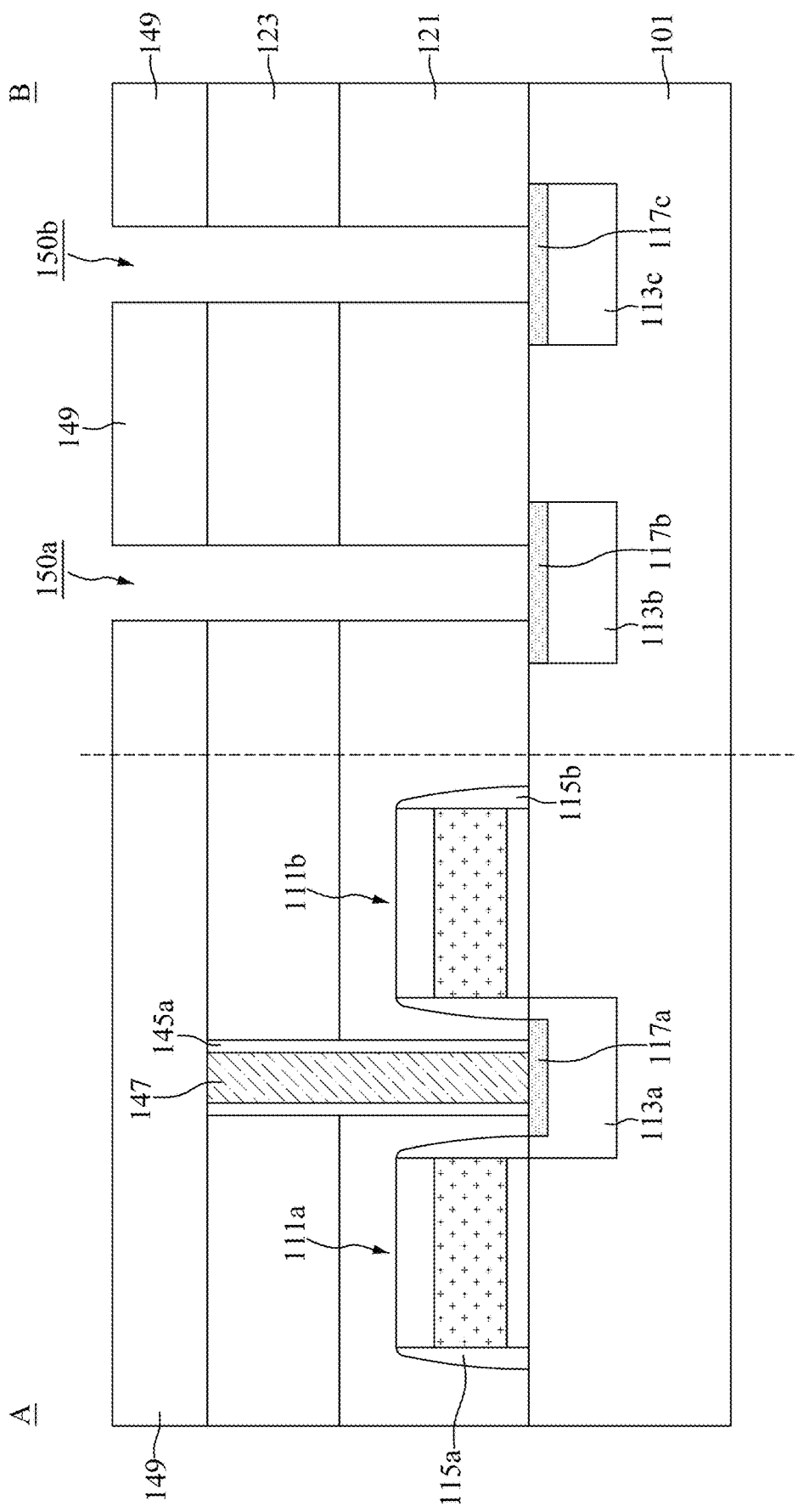
FIG. 15 is a cross-sectional view illustrating an intermediate stage of etching the first dielectric layer and the second dielectric layer to form openings in a peripheral circuit region during the formation of the semiconductor device, in accordance with some embodiments.

Next, a patterned mask 149 is formed over the structure of FIG. 14, and the portions of the first dielectric layer 121 and the second dielectric layer 123 in the peripheral circuit region B are etched by using the patterned mask 149 as a mask, such that the silicide layers 117b, 117c are partially exposed by openings 150a, 150b, respectively, as shown in FIG. 15 in accordance with some embodiments. In some embodiments, as the patterned mask 149 covers the structure in the cell region A, the structure in the cell region A is not etched. The openings 150a and 150b may be formed by a wet etching process, a dry etching process, or a combination thereof. Although the patterned mask 149 remains over the second dielectric layer 123 after the openings 150a and 150b are formed in the present embodiment, the patterned mask 149 may be removed after the openings 150a and 150b are formed.

Figure 16:
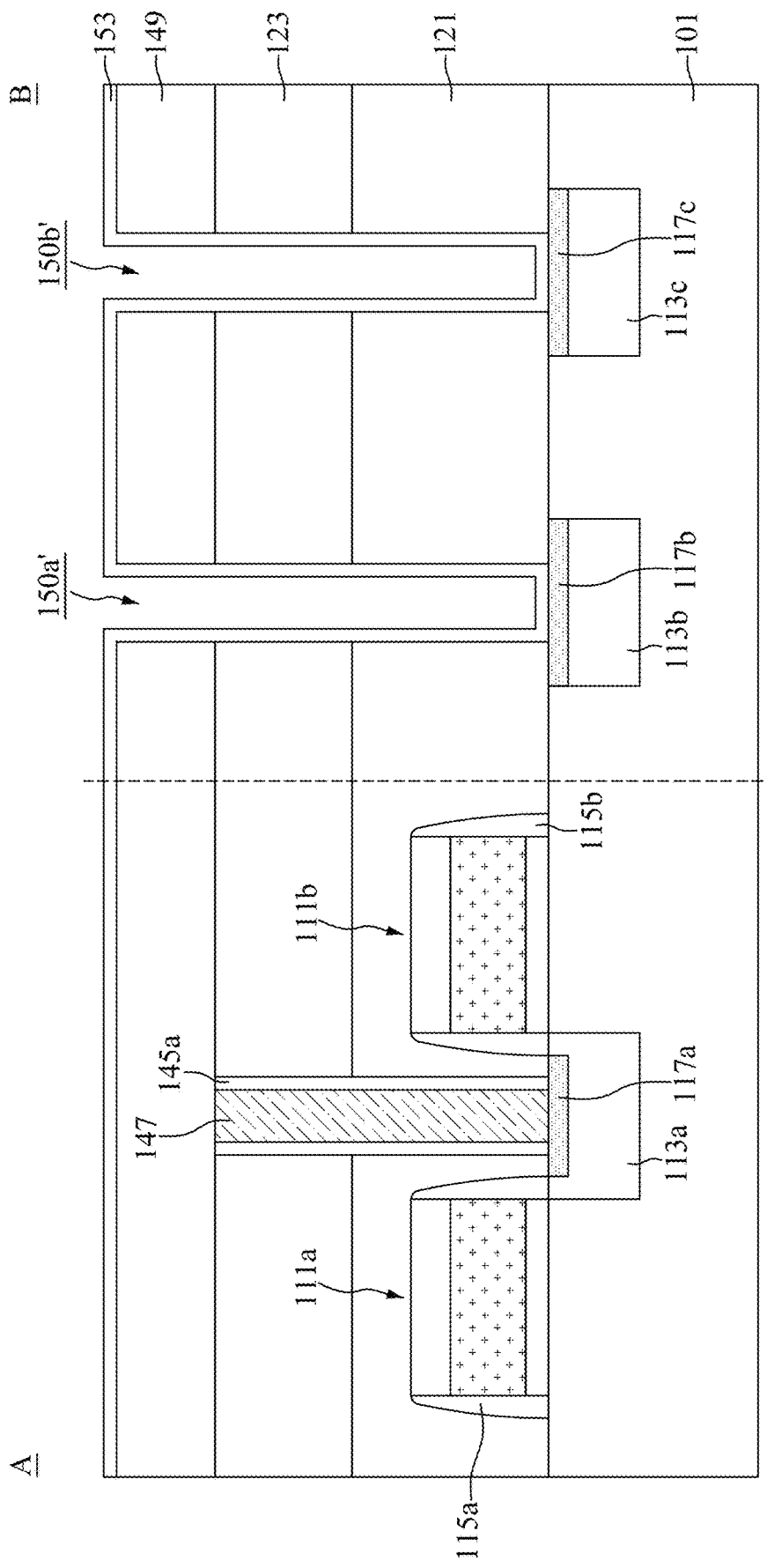
FIG. 16 is a cross-sectional view illustrating an intermediate stage of forming a barrier material lining the openings in the peripheral circuit region during the formation of the semiconductor device, in accordance with some embodiments.

After the silicide layers 117b and 117c in the peripheral circuit region B are partially exposed, a barrier material 153 is conformally deposited over the structure of FIG. 15, as shown in FIG. 16 in accordance with some embodiments. In some embodiments, the barrier material 153 is formed over the top surface of the patterned mask 149 (If the patterned mask 149 is removed after the openings 150a and 150b are formed, the barrier material 153 may be formed over the top surface of the second dielectric layer 123) and lining the sidewalls and the bottom surface of the openings 150a and 150b, such that reduced openings 150a' and 150b' are obtained. In some embodiments, the exposed portions of the silicide layers 117b and 117c are covered by the barrier material 153. Some materials and processes used to form the barrier material 153 are similar to, or the same as those used to form the barrier material 145, and details thereof are not repeated herein.

Figure 17:
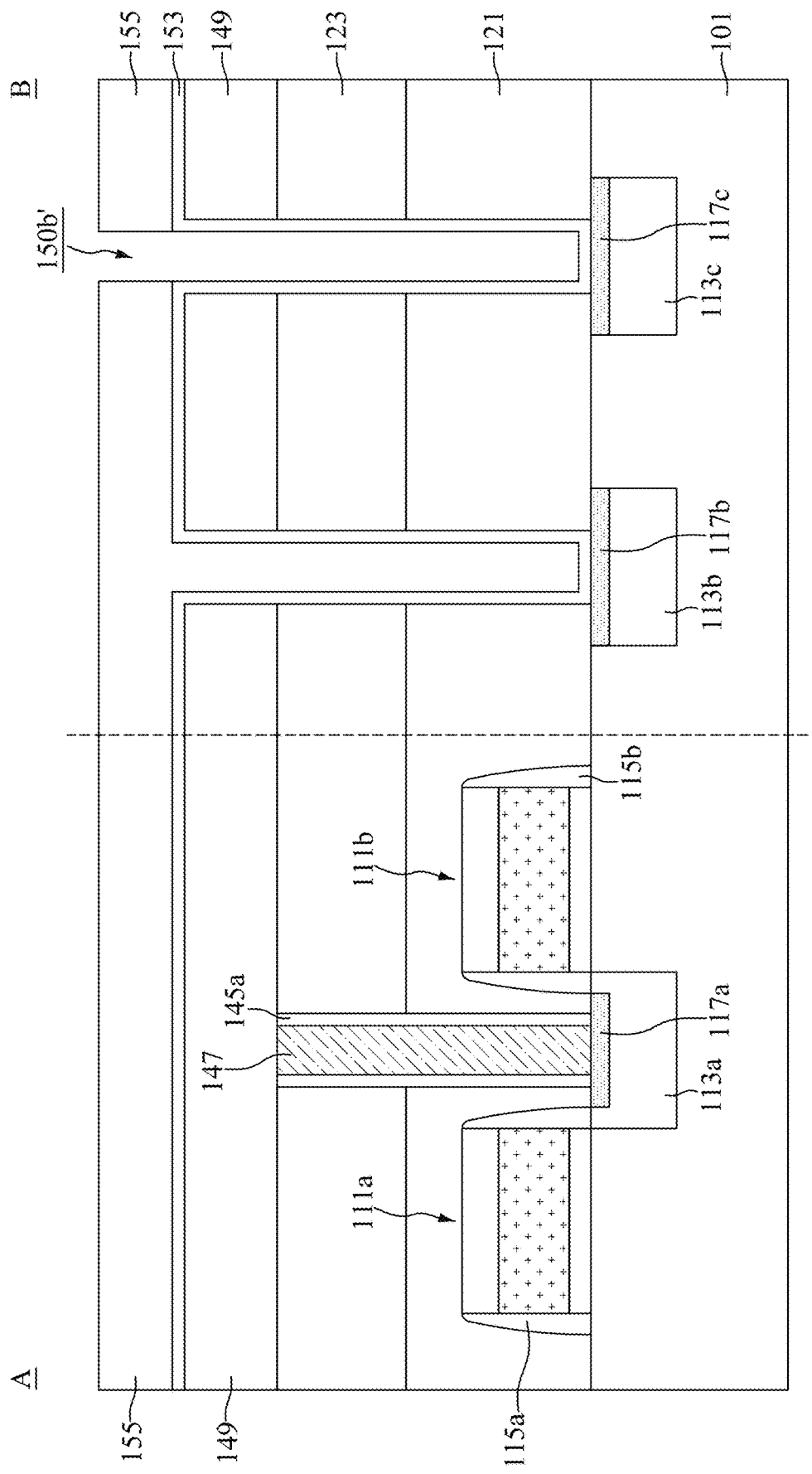
FIG. 17 is a cross-sectional view illustrating an intermediate stage of etching the barrier material in the peripheral circuit region during the formation of the semiconductor device, in accordance with some embodiments.

Subsequently, a patterned mask 155 is formed over the structure of FIG. 17, and the barrier material 153 is etched by using the patterned mask 155 as a mask, such that the silicide layer 117c is partially exposed by a remaining portion of the barrier material 153, as shown in FIG. 17 in accordance with some embodiments. In some embodiments, as the patterned mask 155 covers the structure in the cell region A, the structure in the cell region A is not etched.

Moreover, since the reduced opening 150a' (see FIG. 16) is filled by the patterned mask 155, the silicide layer 117b is not exposed after the etching process of the barrier material 153. The barrier material 153 may be etched by a wet etching process, a dry etching process, or a combination thereof. After the silicide layer 117c is partially exposed, the patterned mask 155 may be removed.

After the silicide layer 117c is partially exposed, a metal material (not shown) is formed in the reduced openings 150a' and 150b' and over the top surface of the barrier material 153, and a planarization process is performed on the metal material to form metal conductive structures 157a and 157b in the reduced openings 150a' and 150b', respectively, as shown in FIG. 1 in accordance with some embodiments. The respective step is illustrated as the step S21 in the method 10 shown in FIG. 3. In some embodiments, the metal conductive structures 157a, 157b are in the peripheral circuit region B and located over the source/drain regions 113b, 113c, respectively.

In some embodiments, the abovementioned metal material (i.e., the metal conductive structures 157a and 157b) is made of tungsten (W), although other metals such as aluminum (Al), copper (Cu), titanium (Ti), tantalum (Ta), and/or the like may also be used. Moreover, the metal material may be formed by a CVD process, a PVD process, an ALD process, an MOCVD process, a sputtering process, a plating process, or another applicable process. In addition, the planarization process may include a chemical mechanical planarization (CMP) process, which removes the portions of the barrier material 153, the patterned mask 149 and the metal material over the second dielectric layer 123.

The remaining portions of the barrier material 153 form a barrier layer 153a surrounding the metal conductive structure 157a and a barrier layer 153b surrounding the metal conductive structure 157b. In some embodiments, the metal conductive structure 157a is separated from the silicide layer 117b by the barrier layer 153a, and the metal conductive structure 157a is in direct contact with the silicide layer 117c. After the metal conductive structures 157a and 157b are formed, the semiconductor device 100 is obtained.

In some embodiments, the graphene conductive structure 147 is disposed to electrically connect the source/drain region 113a in the cell region A to the device element above the semiconductor device 100. Therefore, the resistance of the semiconductor device 100 may be lowered, and resistive-capacitive (RC) delay of signals transmitted through the source/drain region 113a and the device element above the semiconductor device 100 may be reduced. As a result, the operation speed of the semiconductor device 100 may be increased, which significantly improves the overall device performance.

Figure 18:
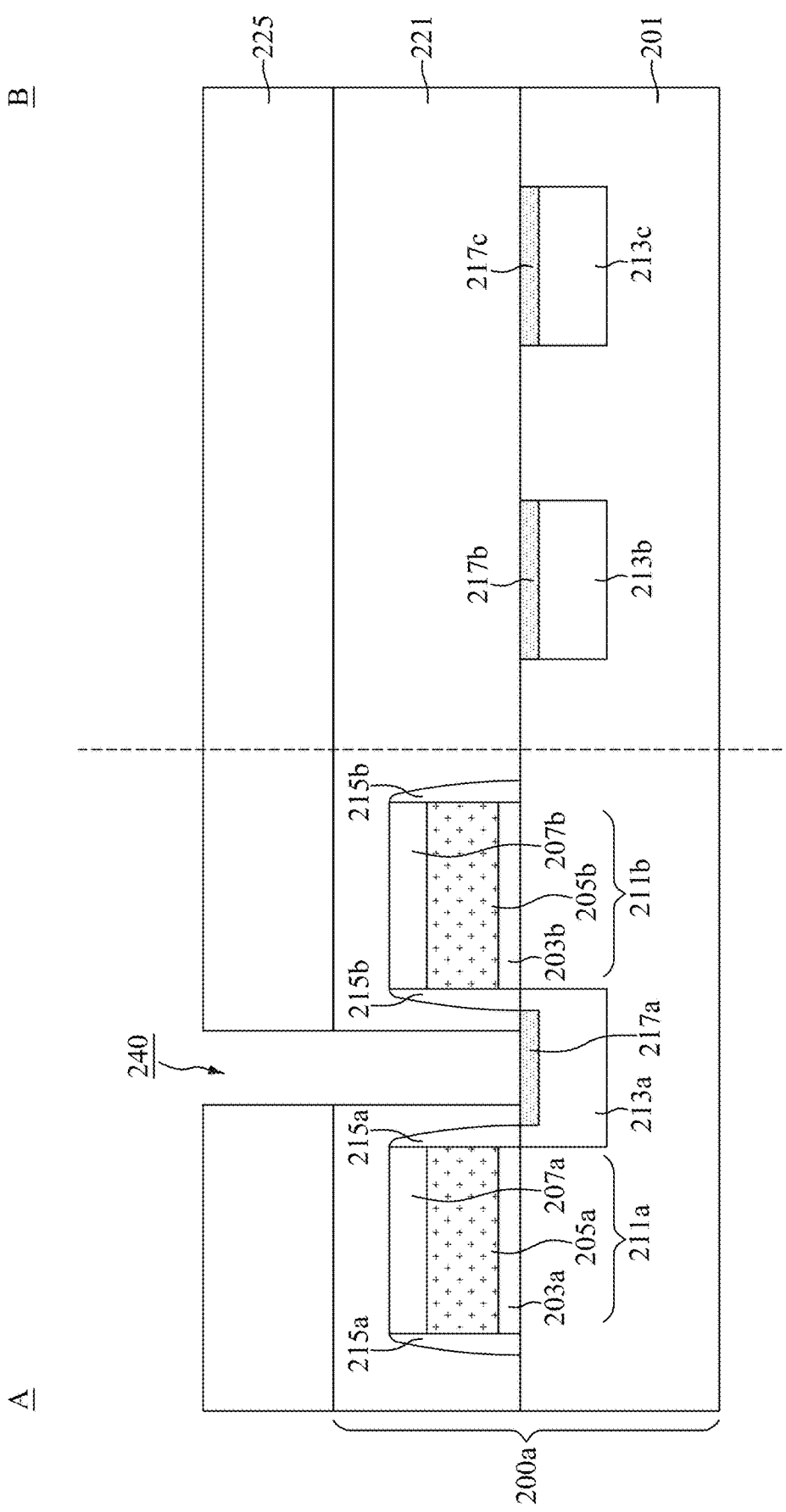
FIG. 18 is a cross-sectional view illustrating an intermediate stage of forming an opening in a cell region of a first semiconductor die during the formation of the modified semiconductor device, in accordance with some embodiments.

FIGS. 18 to 21 are cross-sectional views illustrating intermediate stages of forming the semiconductor device 200, in accordance with some embodiments. As shown in FIG. 18, a first semiconductor die 200a includes a first dielectric layer 221 formed over a first semiconductor substrate 201, source/drain regions 213a, 213b, 213c and silicide layers 217a, 217b, 217c are formed in the first semiconductor substrate 201, and gate structures 211a, 211b and gate spacers 215a, 215b are formed in the first dielectric layer 221. The respective steps are illustrated as the steps S31 to S33 in the method 30 shown in FIG. 4.

The descriptions of the similar features and configurations are not repeated for simplicity. For example, the first semiconductor substrate 201 may similar to the semiconductor substrate 101, the first dielectric layer 221 may be similar to the first dielectric layer 121, the source/drain regions 213a, 213b, 213c may be similar to the source/drain regions 113a, 113b, 113c, the silicide layers 217a, 217b, 217c may be similar to the silicide layers 117a, 117b, 117c, the gate structures 211a, 211b may be similar to the gate structures 111a, 111b, and the gate spacers 215a, 215b may be similar to the gate spacers 115a, 115b.

In particular, the gate structures 211a, 211b include gate dielectric layers 203a, 203b, gate electrode layers 205a, 205b, and gate capping layers 207a, 207b. Some materials and processes used to form the gate dielectric layers 203a, 203b, gate electrode layers 205a, 205b, and the gate capping layers 207a, 207b are similar to, or the same as those used to form the gate dielectric layers 103a, 103b, the gate electrode layers 105a, 105b, and the gate capping layers 107a, 107b, and details thereof are not repeated herein.

Still referring to FIG. 18, a patterned mask 225 is formed over the first semiconductor die 200a, and the first dielectric layer 221 is etched by using the patterned mask 225 as a mask, such that the silicide layer 217a in the cell region A is partially exposed by an opening 240, in accordance with some embodiments. In some embodiments, the opening 240 penetrates through the first dielectric layer 221. The opening 240 may be formed by a wet etching process, a dry etching process, or a combination thereof. After the opening 240 is obtained, the patterned mask 225 may be removed.

Figure 19:
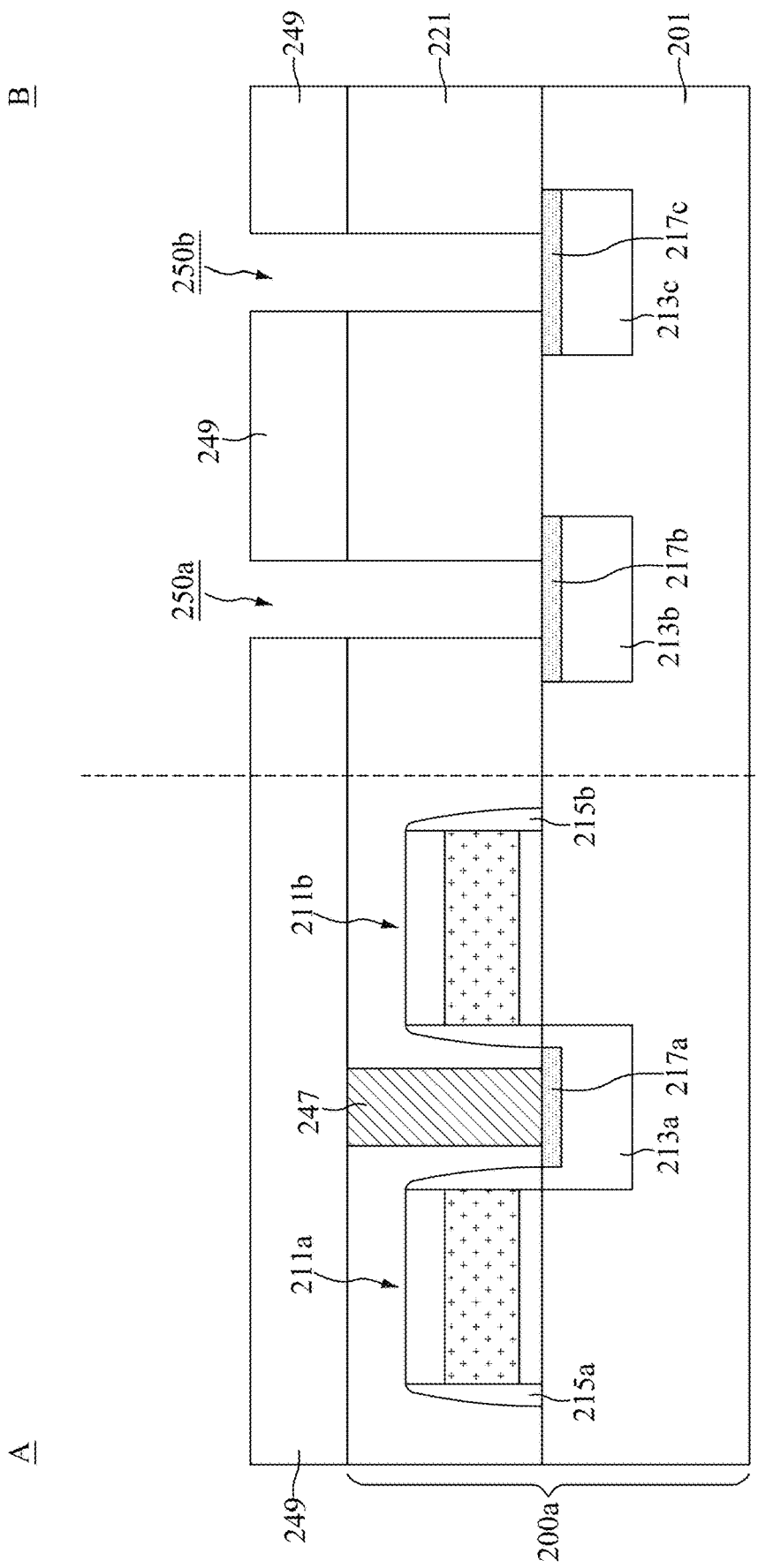
FIG. 19 is a cross-sectional view illustrating an intermediate stage of forming a first graphene conductor in the cell region of the first semiconductor die and forming openings in a peripheral circuit region of the first semiconductor die during the formation of the modified semiconductor device, in accordance with some embodiments.

Next, a first graphene conductor 247 is formed in the opening 240, as shown in FIG. 19 in accordance with some embodiments. The respective step is illustrated as the step S35 in the method 30 shown in FIG. 4. In some embodiments, the first graphene conductor 247 is in the cell region A and located over the source/drain region 213a. In some embodiments, the first graphene conductor 247 is in direct contact with the silicide layer 217a. Some processes used to form the first graphene conductor 247 are similar to, or the same as those used to form the graphene conductive structure 147, and details thereof are not repeated herein.

Then, a patterned mask 249 is formed over the first semiconductor die 200a, and the portion of the first dielectric layer 221 in the peripheral circuit region B is etched by using the patterned mask 249 as a mask, such that the silicide layers 217b, 217c are partially exposed by openings 250a, 250b, respectively, as shown in FIG. 19 in accordance with some embodiments. In some embodiments, as the patterned mask 249 covers the structure in the cell region A, the structure in the cell region A is not etched. The openings 250a and 250b may be formed by a wet etching process, a dry etching process, or a combination thereof. The patterned mask 249 may be removed after the openings 250a and 250b are formed.

Figure 20:
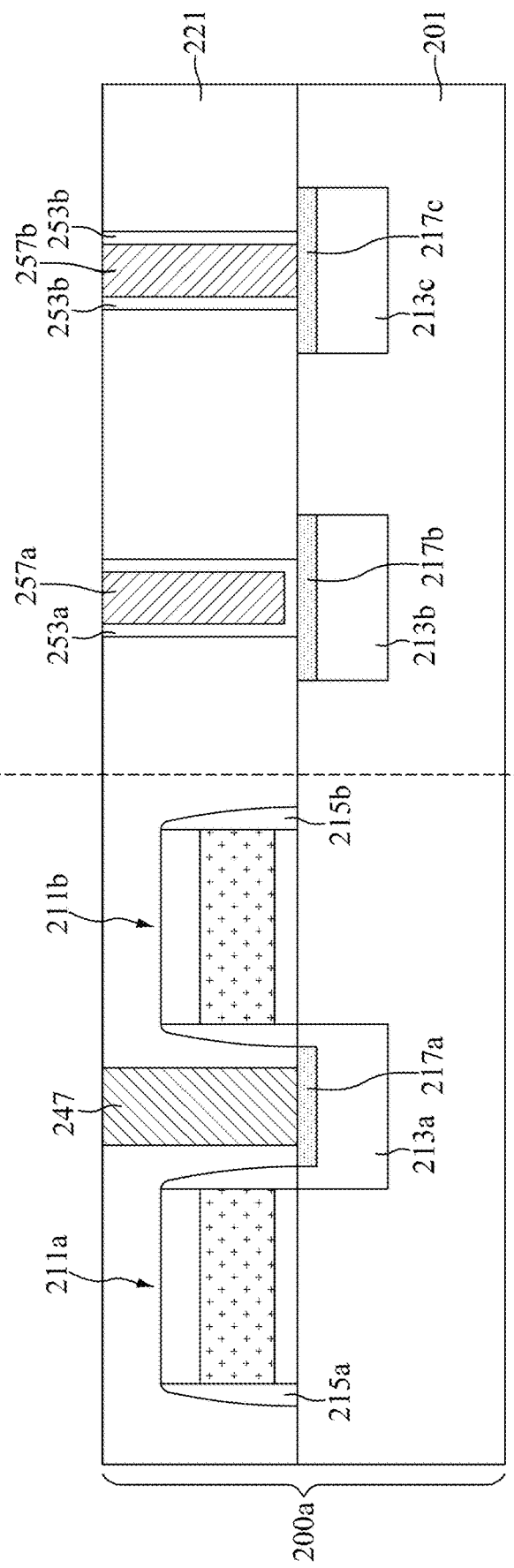
FIG. 20 is a cross-sectional view illustrating an intermediate stage of forming first metal conductors in the peripheral circuit region of the first semiconductor die during the formation of the modified semiconductor device, in accordance with some embodiments.

Subsequently, a barrier layer 253a and a first metal conductor 257a are formed in the opening 250a, and a barrier layer 253b and a first metal conductor 257b are formed in the opening 250b, as shown in FIG. 20 in accordance with some embodiments. The respective step is illustrated as the step S37 in the method 30 shown in FIG. 4.

In some embodiments, the first metal conductor 257a is separated from the silicide layer 217b by the barrier layer 253a, and the first metal conductor 257b is in direct contact with the silicide layer 217c. Some materials and processes used to form the barrier layers 253a, 253b and the first metal conductors 257a, 257b are similar to, or the same as those used to form the barrier layers 153a, 153b and the metal conductive structures 157a, 157b, and details thereof are not repeated herein.

Figure 21:
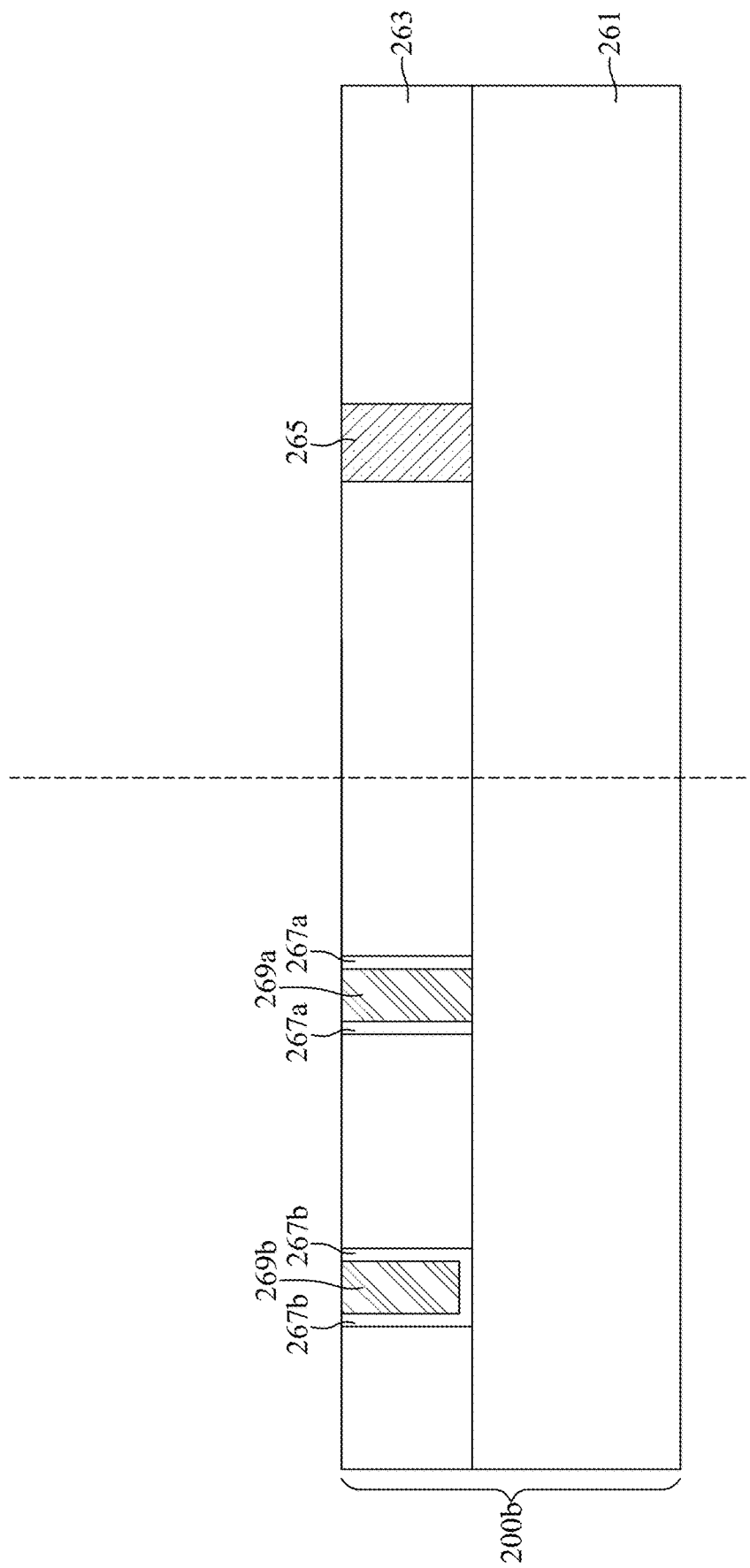
FIG. 21 is a cross-sectional view illustrating an intermediate stage of forming a second graphene conductor in a circuit region of a second semiconductor die and forming second metal conductors in a peripheral circuit region of the second semiconductor die during the formation of the modified semiconductor device, in accordance with some embodiments.

As shown in FIG. 21, a second semiconductor die 200b includes a second semiconductor substrate 261 and a second dielectric layer 263 formed over the second semiconductor substrate 261. The respective step is illustrated as the step S39 in the method 30 shown in FIG. 4.

In some embodiments, the second semiconductor substrate 261 may be a portion of an integrated circuit (IC) chip that includes various passive and active microelectronic devices, such as resistors, capacitors, inductors, diodes, p-type field effect transistors (pFETs), n-type field effect transistors (nFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, fin field-effect transistors (FinFETs), other suitable IC components, or combinations thereof.

Depending on the IC fabrication stage, the second semiconductor substrate 261 may include various material layers (e.g., dielectric layers, semiconductor layers, and/or conductive layers) configured to form IC features (e.g., doped regions, isolation features, gate features, source/drain features, interconnect features, other features, or combinations thereof). The second semiconductor substrate 261 has been simplified for the sake of clarity. It should be noted that additional features can be added in the second semiconductor substrate 261. Moreover, some materials and processes used to form the second dielectric layer 263 of the second semiconductor die 200b are similar to, or the same as those used to form the first dielectric layer 221 of the first semiconductor die 200a, and details thereof are not repeated herein.

Still referring to FIG. 21, the second semiconductor die 200b includes a cell region A and a peripheral circuit region B adjacent to the cell region A. In some embodiments, a second graphene conductor 265 is formed in the portion of the second dielectric layer 263 in the cell region A, and barrier layers 267a, 267b and second metal conductors 269a, 269b are formed in the portion of the second dielectric layer 263 in the peripheral region B. The respective step is illustrated as the step S41 in the method 30 shown in FIG. 4.

In some embodiments, the second metal conductor 269a is surrounded by the barrier layer 267a, and the second metal conductor 269b is surrounded by the barrier layer 267b. Some materials and processes used to form the second graphene conductor 265, the barrier layers 267a, 267b and the second metal conductors 269a, 269b are similar to, or the same as those used to form the graphene conductive structure 147, the barrier layers 153a, 153b and the metal conductive structures 157a, 157b, and details thereof are not repeated herein.

Next, the second semiconductor die 200b is flipped upside down and bonded onto the first semiconductor die 200a with the second dielectric layer 263 facing the first dielectric layer 221, as shown in FIG. 2 in accordance with some embodiments. After the bonding process, the second graphene conductor 265 is bonded onto the first graphene conductor 247 to form a graphene conductive structure 271, and the second metal conductors 269a, 269b are bonded onto the first metal conductors 257a, 257b to form metal conductive structures 275a, 275b, respectively. The respective step is illustrated as the step S43 in the method 30 shown in FIG. 4. After the bonding process, the semiconductor device 200 is obtained.

Figure 22:
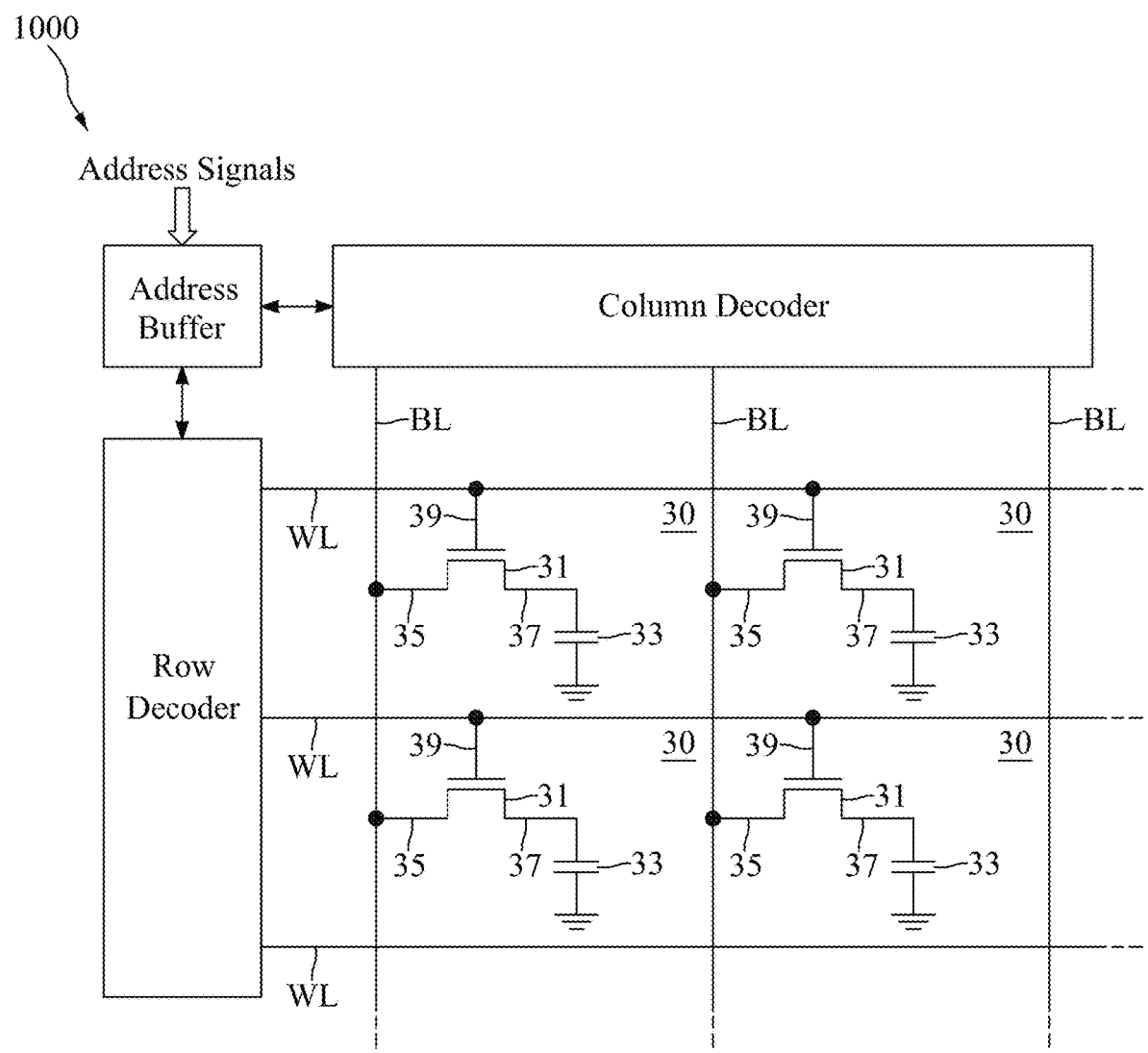
FIG. 22 is a partial schematic illustration of an exemplary integrated circuit, including an array of memory cells in accordance with some embodiments.

FIG. 22 is a partial schematic illustration of an exemplary integrated circuit, such as a memory device 1000, including an array of memory cells 30 in accordance with some embodiments. In some embodiments, the memory device 1000 includes a DRAM. In some embodiments, the memory device 1000 includes a number of memory cells 30 arranged in a grid pattern and including a number of rows and columns. The number of memory cells 30 may vary depending on system requirements and fabrication technology.

In some embodiments, each of the memory cells 30 includes an access device and a storage device. The access device is configured to provide controlled access to the storage device. In particular, the access device is a field effect transistor (FET) 31 and the storage device is a capacitor 33, in accordance with some embodiments. In each of the memory cells 30, the FET 31 includes a drain 35, a source 37 and a gate 39. One terminal of the capacitor 33 is electrically connected to the source 37 of the FET 31, and the other terminal of the capacitor 33 may be electrically connected to the ground. In addition, in each of the memory cells 30, the gate 39 of the FET 31 is electrically connected to a word line WL, and the drain 35 of the FET 31 is electrically connected to a bit line BL.

The above description mentions the terminal of the FET 31 electrically connected to the capacitor 33 is the source 37, and the terminal of the FET 31 electrically connected to the bit line BL is the drain 35. However, during read and write operations, the terminal of the FET 31 electrically connected to the capacitor 33 may be the drain, and the terminal of the FET 31 electrically connected to the bit line BL may be the source. That is, either terminal of the FET 31 could be a source or a drain depending on the manner in which the FET 31 is being controlled by the voltages applied to the source, the drain and the gate.

By controlling the voltage at the gate 39 via the word line WL, a voltage potential may be created across the FET 30 such that the electrical charge can flow from the drain 35 to the capacitor 33. Therefore, the electrical charge stored in the capacitor 33 may be interpreted as a binary data value in the memory cell 30. For example, a positive charge above a threshold voltage stored in the capacitor 33 may be interpreted as binary "1." If the charge in the capacitor 33 is below the threshold value, a binary value of "0" is said to be stored in the memory cell 30.

The bit lines BL are configured to read and write data to and from the memory cells 30. The word lines WL are configured to activate the FET 31 to access a particular row of the memory cells 30. Accordingly, the memory device 1000 also includes a periphery circuit region which may include an address buffer, a row decoder and a column decoder. The row decoder and the column decoder selectively access the memory cells 30 in response to address signals that are provided to the address buffer during read, write and refresh operations. The address signals are typically provided by an external controller such as a microprocessor or another type of memory controller.

Referring back to FIGS. 1 and 2, the graphene conductive structures 147 and 271 are formed in the cell regions A of the semiconductor devices 100 and 200, while the metal conductive structures 157a, 157b, 275a, 275b formed in the peripheral circuit regions B of the semiconductor devices 100 and 200. In some embodiments, the cell regions A of the semiconductor devices 100 and 200 may be any of the regions of the memory cells 30 in the memory device 1000, and the peripheral circuit regions B of the semiconductor devices 100 and 200 may be any of the regions of the address buffer, the row decoder, or the column decoder in the memory device 1000.

Embodiments of the semiconductor devices 100 and 200 are provided in the disclosure. To lower the resistance, the semiconductor device 100 includes the graphene conductive structure 147 disposed over the source/drain region 113a, and the semiconductor device 200 includes the graphene conductive structure 271 disposed over the source/drain region 213a. Since graphene is a low-resistance conductive material, resistive-capacitive (RC) delay of signals transmitted through the device elements (e.g., the source/drain region and the device element over the graphene conductive structure) can be reduced. Therefore, the operation speed of the semiconductor devices 100 and 200 may be increased, which significantly improves the overall device performance.

In one embodiment of the present disclosure, a semiconductor device is provided. The semiconductor device includes a first gate structure disposed over a semiconductor substrate, and a first source/drain region disposed in the semiconductor substrate and adjacent to the first gate structure. The semiconductor device also includes a first silicide layer disposed in the semiconductor substrate and over the first source/drain region, and a graphene conductive structure disposed over the first silicide layer. The semiconductor device further includes a first dielectric layer covering the first gate structure, and a second dielectric layer disposed over the first dielectric layer. The graphene conductive structure is surrounded by the first dielectric layer and the second dielectric layer.

In another embodiment of the present disclosure, a semiconductor device is provided. The semiconductor device includes a first source/drain region and a second source/drain region disposed in a semiconductor substrate. The first source/drain region is disposed in a cell region, and the second source/drain region is disposed in a peripheral circuit region. The semiconductor device also includes a first gate structure and a second gate structure disposed over the semiconductor substrate and in the cell region. The first source/drain region is between the first gate structure and the second gate structure. The semiconductor device further includes a graphene conductive structure disposed in the cell region and over the first source/drain region, and a first metal conductive structure disposed in the peripheral circuit region and over the second source/drain region.

In yet another embodiment of the present disclosure, a semiconductor device is provided. The semiconductor device includes a first semiconductor die, and a second semiconductor die bonded to the first semiconductor die. The first semiconductor die includes a semiconductor substrate, a first source/drain region disposed in the semiconductor substrate, and a first silicide layer disposed in the semiconductor substrate and over the first source/drain region. The first semiconductor die also includes a gate structure disposed over the first semiconductor substrate and adjacent to the first source/drain region, and a first dielectric layer disposed over the first semiconductor substrate and surrounding the gate structure. The second semiconductor die includes a second dielectric layer facing the first dielectric layer of the first semiconductor die. The semiconductor die also includes a graphene conductive structure penetrating through the first dielectric layer of the first semiconductor die and the second dielectric layer of the second semiconductor die. The graphene conductive structure is electrically connected to the first silicide layer.

The embodiments of the present disclosure have some advantageous features. By forming a graphene conductive structure as an interconnecting structure, the resistance may be decreased. As a result, the operation speed of the semiconductor device is increased, which significantly improves the overall device performance.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device, comprising:
a first semiconductor die comprising:
a semiconductor substrate;
a first source/drain region disposed in the semiconductor substrate;
a first silicide layer disposed in the semiconductor substrate and over the first source/drain region;
a gate structure disposed over the first semiconductor substrate and adjacent to the first source/drain region; and
a first dielectric layer disposed over the first semiconductor substrate and surrounding the gate structure;
a second semiconductor die bonded to the first semiconductor die, wherein the second semiconductor die comprises a second dielectric layer facing the first dielectric layer of the first semiconductor die; and
a graphene conductive structure penetrating through the first dielectric layer of the first semiconductor die and the second dielectric layer of the second semiconductor die, wherein the graphene conductive structure is electrically connected to the first silicide layer.

2. The semiconductor device of claim 1, wherein the graphene conductive structure is in direct contact with the first dielectric layer of the first semiconductor die and the second dielectric layer of the second semiconductor die.

3. The semiconductor device of claim 1, wherein the graphene conductive structure comprises a first graphene conductor and a second graphene conductor bonded onto the first graphene conductor, the first graphene conductor is surrounded by the first dielectric layer of the first semiconductor die, and the second graphene conductor is surrounded by the second dielectric layer of the second semiconductor die.

4. The semiconductor device of claim 1, wherein the semiconductor device comprises a cell region and a peripheral circuit region adjacent to the cell region, and wherein the first source/drain region, the first silicide layer, the gate structure and the graphene conductive structure are disposed in the cell region.

5. The semiconductor device of claim 4, wherein the peripheral circuit region of the semiconductor device comprises:
a second source/drain region and a second silicide layer disposed in the semiconductor substrate of the first semiconductor die, wherein the second silicide layer is disposed over the second source/drain region;
a metal conductive structure surrounded by the first dielectric layer of the first semiconductor die and the second dielectric layer of the second semiconductor die.

6. The semiconductor device of claim 5, wherein the metal conductive structure comprises a first metal conductor in the first semiconductor die and a second metal conductor in the second semiconductor die and bonded onto the first metal conductor, and wherein the semiconductor device further comprises:
a first barrier layer separating the first metal conductor and the first dielectric layer of the first semiconductor die; and
a second barrier layer separating the second metal conductor and the second dielectric layer of the second semiconductor die.

7. The semiconductor device of claim 6, wherein the first metal conductor of the metal conductive structure is separated from the second silicide layer by the first barrier layer.

* * * * *